US011770967B2

(12) United States Patent
Shin et al.

(10) Patent No.: US 11,770,967 B2
(45) Date of Patent: *Sep. 26, 2023

(54) ELECTRONIC DEVICE WITH MOVABLE FLEXIBLE DISPLAY AND OPERATING METHOD THEREOF

(71) Applicant: Samsung Electronics Co., Ltd., Suwon-si (KR)

(72) Inventors: Jaeyoung Shin, Suwon-si (KR); Moohyun Baek, Suwon-si (KR); Youngsoo Chun, Suwon-si (KR); Seungmin Choi, Suwon-si (KR); Byounguk Yoon, Suwon-si (KR); Soyoung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 364 days.

This patent is subject to a terminal disclaimer.

(21) Appl. No.: 17/120,768

(22) Filed: Dec. 14, 2020

(65) Prior Publication Data

US 2021/0098723 A1 Apr. 1, 2021

Related U.S. Application Data

(63) Continuation of application No. 16/366,391, filed on Mar. 27, 2019, now Pat. No. 10,868,264.

(30) Foreign Application Priority Data

Mar. 27, 2018 (KR) .......................... 10-2018-0035383

(51) Int. Cl.
*G06F 1/16* (2006.01)
*H10K 77/10* (2023.01)
(Continued)

(52) U.S. Cl.
CPC .......... *H10K 77/111* (2023.02); *G06F 1/1601* (2013.01); *G06F 3/041* (2013.01);
(Continued)

(58) Field of Classification Search
CPC .... H10K 77/111; H10K 50/841; H10K 59/12; H10K 59/40; H10K 59/65;
(Continued)

(56) References Cited

U.S. PATENT DOCUMENTS 10,881,009 B2* 12/2020 Jiang ..................... H05K 5/0017
2008/0030475 A1 2/2008 Shin
(Continued)

FOREIGN PATENT DOCUMENTS

EP 3 021 192 A1 5/2016
KR 10-2008-0013115 A 2/2008
(Continued)

OTHER PUBLICATIONS

Korean Notice of Patent Grant dated Jul. 26, 2022, issued in Korean Patent Application No. 10-2018-0035383.
(Continued)

*Primary Examiner* — Abhishek M Rathod
(74) *Attorney, Agent, or Firm* — Jefferson IP Law, LLP

(57) ABSTRACT

An electronic device is provided. The electronic device includes a flexible touchscreen layer movable between an open state and a closed state and having a periphery located at a first distance from a first sidewall in the closed state, and located at a second distance longer than the first distance from the first sidewall in the open state. When the flexible touchscreen layer is moved from the open state to the closed state, at least part of the bendable portion may be led out from a recess to construct substantially a plane. When the flexible touchscreen layer is moved from the closed state to the open state, at least part of the bendable portion may be
(Continued)

led into the recess to expose at least one of an inner structure having various modules disposed thereon or electronic component for access and/or use.

12 Claims, 27 Drawing Sheets

(51) Int. Cl.
| | |
|---|---|
| *G06F 3/041* | (2006.01) |
| *H04M 1/02* | (2006.01) |
| *G06F 3/0488* | (2022.01) |
| *H10K 50/84* | (2023.01) |
| *H10K 59/12* | (2023.01) |
| *H10K 59/40* | (2023.01) |
| *H10K 59/65* | (2023.01) |
| *H10K 102/00* | (2023.01) |

(52) U.S. Cl.
CPC ........ *G06F 3/0488* (2013.01); *H04M 1/0235* (2013.01); *H04M 1/0245* (2013.01); *H04M 1/0268* (2013.01); *H10K 50/841* (2023.02); *H10K 59/12* (2023.02); *H10K 59/40* (2023.02); *H10K 59/65* (2023.02); *G06F 1/163* (2013.01); *G06F 1/1652* (2013.01); *G06F 2203/04102* (2013.01); *G09G 2354/00* (2013.01); *H10K 2102/311* (2023.02)

(58) Field of Classification Search
CPC . H10K 2102/311; G06F 1/1601; G06F 3/041; G06F 3/0488; G06F 1/163; G06F 1/1652; G06F 2203/04102; G06F 1/1628; G06F 1/1686; G06F 1/1688; G06F 1/169; H04M 1/0235; H04M 1/0245; H04M 1/0268; G09G 2354/00; Y02E 10/549
See application file for complete search history.

(56) References Cited

U.S. PATENT DOCUMENTS

| | | | |
|---|---|---|---|
| 2008/0165439 A1* | 7/2008 | Chang | ................ H04M 1/0264 359/822 |
| 2013/0021427 A1 | 1/2013 | Park et al. | |
| 2013/0058063 A1 | 3/2013 | O'Brien | |
| 2014/0204037 A1 | 7/2014 | Kim | |
| 2015/0229746 A1* | 8/2015 | Bergin | ................ H04M 1/185 455/556.1 |
| 2016/0018855 A1 | 1/2016 | Liao et al. | |
| 2016/0143131 A1 | 5/2016 | Ahn | |
| 2016/0202781 A1 | 7/2016 | Kim et al. | |
| 2017/0064847 A1 | 3/2017 | Lim | |
| 2017/0154609 A1 | 6/2017 | Yoon et al. | |
| 2017/0212607 A1 | 7/2017 | Toon | |
| 2017/0287992 A1 | 10/2017 | Kwak et al. | |
| 2017/0308126 A1* | 10/2017 | Yang | .................... G06F 1/1652 |
| 2018/0007243 A1* | 1/2018 | Maatta | .................. H04N 23/51 |
| 2018/0255219 A1* | 9/2018 | Ramaprakash | ........ H04N 23/90 |

FOREIGN PATENT DOCUMENTS

| | | | |
|---|---|---|---|
| KR | 10-2013-0011177 A | 1/2013 | |
| KR | 10-2016-0058329 A | 5/2016 | |
| KR | 10-2016-0087460 A | 7/2016 | |
| KR | 10-2017-0076755 A | 7/2017 | |
| KR | 10-2017-0089664 A | 8/2017 | |
| WO | 2015/015048 A1 | 2/2015 | |
| WO | 2015/030432 A1 | 3/2015 | |
| WO | 2016/129701 A1 | 8/2016 | |
| WO | 2017/032092 A1 | 3/2017 | |

OTHER PUBLICATIONS

Indian Office Action dated Jul. 27, 2022, issued in Indian Patent Application No. 202017044714.
International Search Report with Written Opinion dated Jul. 2, 2019; International Appln. No. PCT/KR2019/003484.
European Search Report dated Jul. 10, 2019; European Appln. No. 19165524.0-1221.
Korean Office Action dated Jan. 26, 2022, issued in a counterpart Korean Application No. 10-2018-0035383.
Chinese Office Action dated May 13, 2023, issued in Chinese Application No. 201980020796.8.

* cited by examiner

ELECTRONIC DEVICE WITH MOVABLE FLEXIBLE DISPLAY AND OPERATING METHOD THEREOF

CROSS-REFERENCE TO RELATED APPLICATION(S)

This application is a continuation application of prior application Ser. No. 16/366,391, filed on Mar. 27, 2019, which application is based on and claims priority under 35 U.S.C. § 119(a) of a Korean patent application number 10-2018-0035383, filed on Mar. 27, 2018, in the Korean Intellectual Property Office, the disclosure of which is incorporated by reference herein in its entirety.

BACKGROUND

1. Field

The disclosure relates to an electronic device including a movable flexible display, and an operating method thereof.

2. Description of Related Art

With the development of digital technologies, electronic devices are provided in various forms, such as a smart phone, a tablet personal computer (PC), a personal digital assistant (PDA), or the like. The electronic device is also developed such that it is worn by a user to improve portability and user accessibility. In addition, the electronic devices are being designed to provide a larger screen while having a portable size which is not inconvenient when it is carried by using a user's hand.

Further, when installing a display for a larger screen while maintaining the size of the electronic device, it is difficult to secure a space for installing electronic components spatially related to the display, which may lead to difficulty in the installing of the electronic components. Although some regions of the display may be removed and the electronic components may be disposed or arranged in the removed regions, this may degrade design aesthetics.

The above information is presented as background information only, and to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages, and to provide at least the advantages described below. Accordingly, an aspect of the disclosure is to provide an electronic device including a moveable flexible display and an operating method thereof.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first plate having a first face and a second face facing away from the first face, a first sidewall perpendicular to the first plate, a second sidewall perpendicular to the first sidewall and the first plate, a third sidewall perpendicular to the first sidewall and the first plate and parallel to the second sidewall, and a fourth sidewall perpendicular to the first plate and parallel to the first sidewall, and a recess consisting of the first face of the first plate, the first sidewall, the second sidewall, the third sidewall, and the fourth sidewall, an inner structure extended from the first sidewall, the second sidewall, and the third sidewall, and disposed to be spaced apart from the first plate, and a flexible touchscreen layer movable between an open state and a closed state with respect to the first sidewall in a first direction parallel to the first plate and the second sidewall. The flexible touchscreen layer may have a periphery extended along the first sidewall. The periphery may be located at a first distance from the first sidewall in the closed state, and may be located at a second distance longer than the first distance from the first sidewall in the open state. The flexible touchscreen layer may include a planar portion extended to cover at least part of the recess, and a bendable portion located in the vicinity of the fourth sidewall and extended to the recess from the planar portion. When the flexible touchscreen layer is moved from the open state to the closed state, at least part of the bendable portion may be led out from the recess to construct substantially a plane between the planar portion and the fourth sidewall.

In accordance with another aspect of the disclosure, an electronic device including a movable flexible display is designed in a structure in which a portion utilized by at least one electronic component is exposed when one side region of the flexible display is led into a housing. Therefore, a screen can be easily extended without an increase in a size of the electronic device while maintaining the at least one electronic component spatially related to the display.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

Figure 1A:
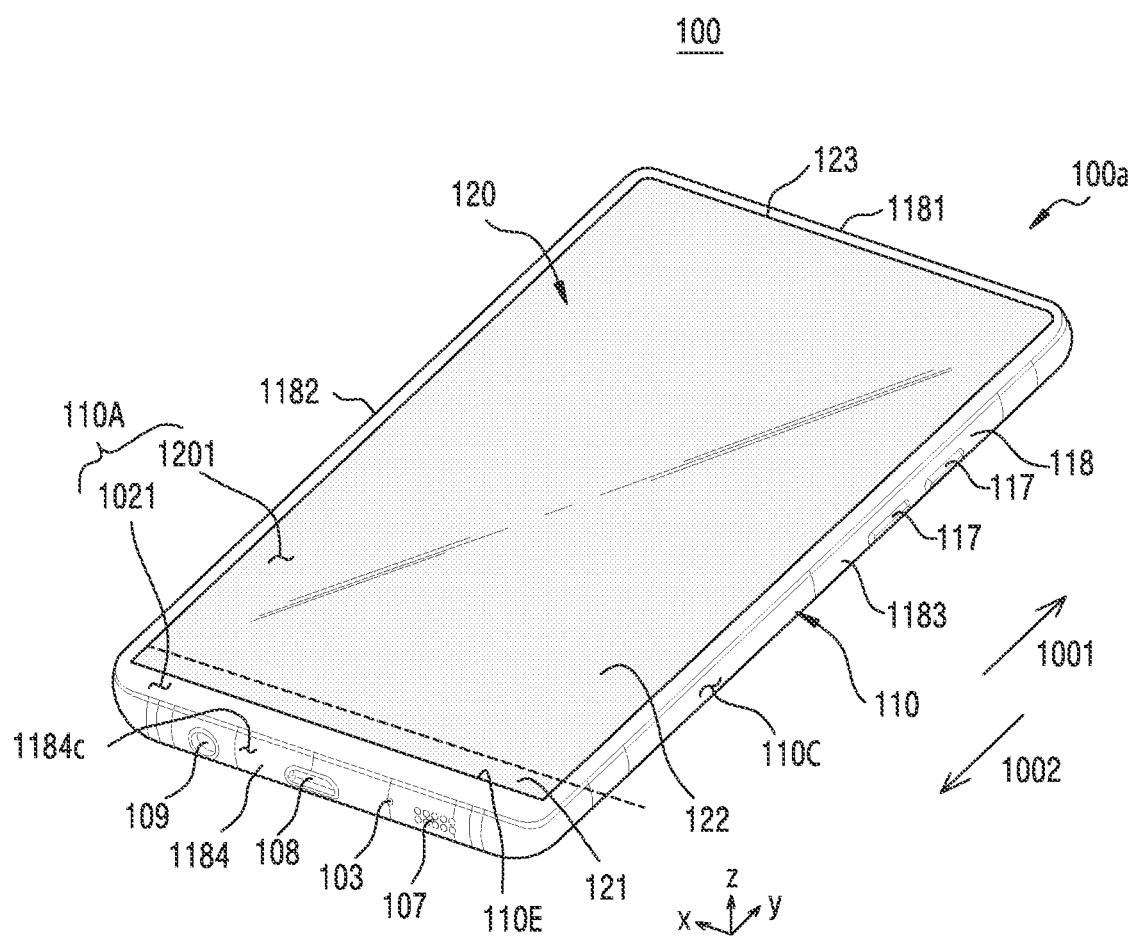
FIG. 1A is a front perspective view of an electronic device including a movable flexible display according to an embodiment of the disclosure.

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used to enable a clear and consistent understanding of the disclosure. Accordingly, it should be apparent to those skilled in the art that the following description of various embodiments of the disclosure is provided for illustration purpose only, and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element. An expression "configured to" used in the document may be interchangeably used with, for example, "suitable for", "having the capacity to", "adapted to", "made to", "capable of", or "designed to" in a hardware or software manner according to a situation. In a certain situation, an expressed "a device configured to" may imply that the device is "capable of" together with other devices or components.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

In various embodiments, the wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device (e.g., an implantable circuit). According to some embodiments, the electronic device may include, for example, at least one of a television (TV), a digital video disc (DVD) player, an audio player, a refrigerator, an air conditioner, a cleaner, an oven, a microwave oven, a washing machine, an air purifier, a set-top box, a home automation control panel, a security control panel, a TV box (e.g., Samsung HomeSync™, Apple TV™, or Google TV™), a game console (e.g., Xbox™ PlayStation™), an electronic dictionary, an electronic key, a camcorder, and an electronic picture frame.

According to various embodiments, the electronic device may include at least one of various medical devices (e.g., various portable medical measuring devices (e.g., a blood sugar measuring device, a heart rate measuring device, a blood pressure measuring device, a body temperature measuring device, etc.), magnetic resonance angiography (MRA), magnetic resonance imaging (MRI), computed tomography (CT), imaging equipment, ultrasonic instrument, etc.)), a navigation device, a global positioning system (GPS) receiver, an event data recorder (EDR), a flight data recorder (FDR), a car infotainment device, an electronic equipment for ship (e.g., a vessel navigation device, a gyro compass, etc.), avionics, a security device, a car head unit, an industrial or domestic robot, a drone, an automatic teller's machine (ATM) of financial institutions, point of sales (POS) of shops, and internet of things (e.g., a light bulb, various sensors, an electric or gas meter, a sprinkler device, a fire alarm, a thermostat, a streetlamp, a toaster, a fitness equipment, a hot water tank, a heater, a boiler, etc.). According to some embodiments, the electronic device may include at least one of part of furniture, buildings/constructions or cars, an electronic board, an electronic signature receiving device, a projector, and various measurement machines (e.g., water supply, electricity, gas, propagation measurement machine, etc.). The electronic device according to various embodiments may be flexible, or may be a combination of two or more of the aforementioned various devices. The electronic device according to an embodiment of the document is not limited to the aforementioned devices. The term 'user' used in the document may refer to a person who uses the electronic device or a device (e.g., an artificial intelligence (AI) electronic device) which uses the electronic device.

Figure 1B:
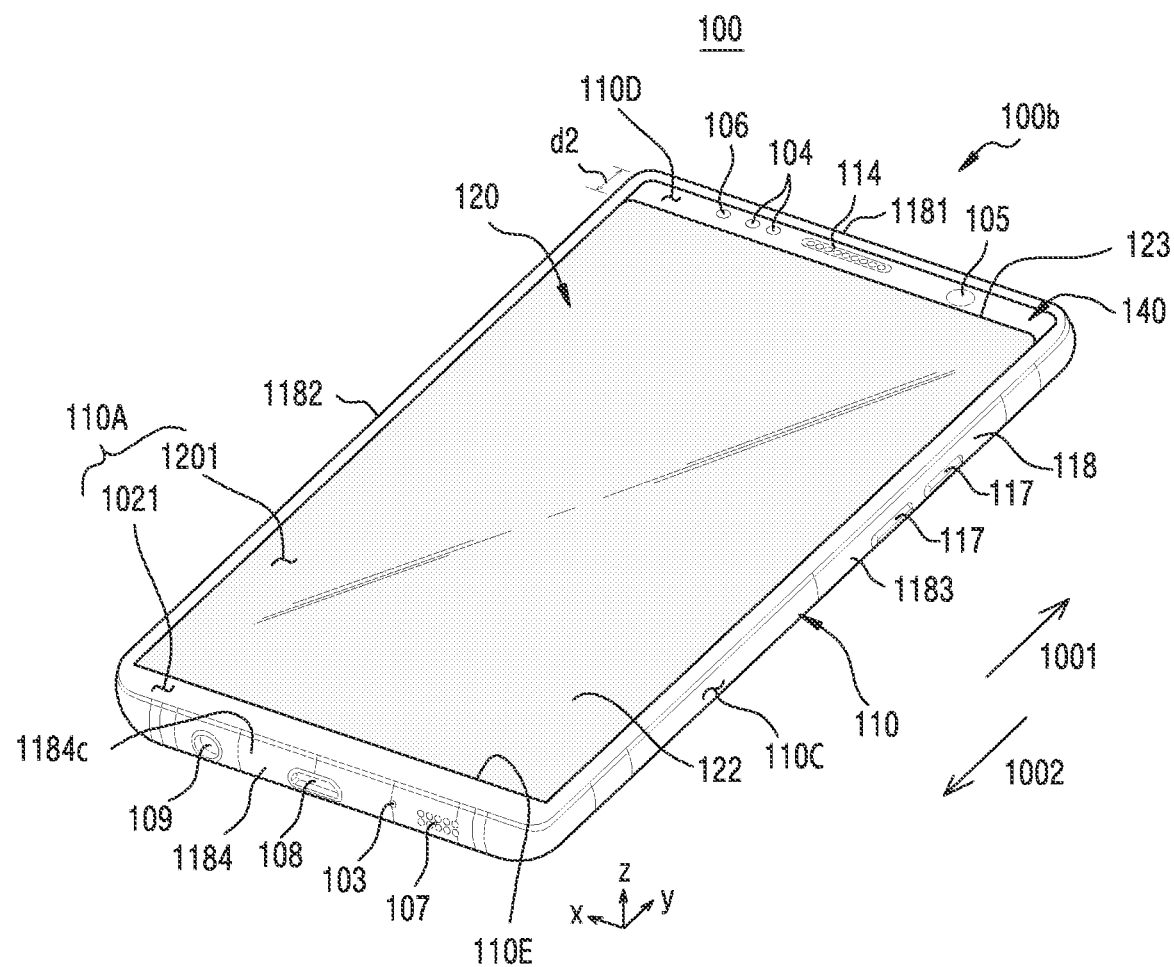
FIG. 1B is a front perspective view of an electronic device including a movable flexible display according to an embodiment of the disclosure.
Figure 2:
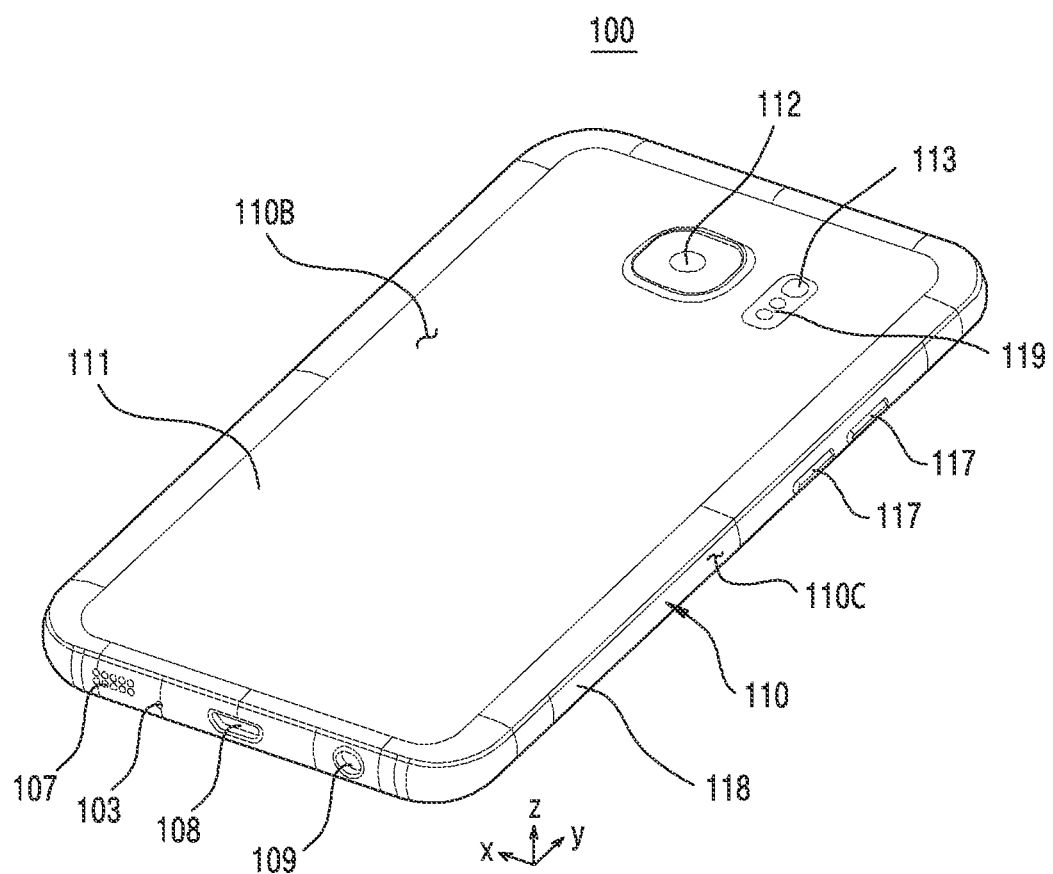
FIG. 2 is a rear perspective view of the electronic device of FIG. 1A according to an embodiment of the disclosure.

FIG. 1A is a front perspective view of an electronic device including a movable flexible display in a closed state according to an embodiment of the disclosure. FIG. 1B is a front perspective view of an electronic device including a movable flexible display in an open state according to an embodiment of the disclosure. FIG. 2 is a rear perspective view of the electronic device of FIG. 1A according to an embodiment of the disclosure.

Referring to FIGS. 1A, 1B, and 2, an electronic device 100 according to an embodiment of the disclosure may include a housing 110 and a flexible display 120 disposed movably in the housing 110. A bendable portion 121 of the flexible display 120 may be coupled to the housing 110 such that it can be led into the housing 110. The electronic device 110 may be in a closed state 100a (or a first state) when the bendable portion 121 of the flexible display 120 is led into the housing 110, and may be in an open state 100b (or a second state) when the bendable portion 121 of the flexible display 120 is led out from the housing 110.

An exterior of the electronic device 100 according to an embodiment may include a front face 110A, a rear face 110B, and a side face 110C surrounding a space between the front face 110A and the rear face 110B. The electronic device 100 may include the housing 110 constructing a region 1021 of the front face 110A (hereinafter, a bezel region), the rear face 110B, and the side face 110C. According to an embodiment, the flexible display 120 may include a screen region 1201 surrounded by the bezel region 1021 which has a generally rectangular ring shape, and the screen region 1201 may construct the front face 110A together with the bezel region 1021. The screen region 1201 may be defined as a region in which an image can be displayed. According to various embodiments, at least part of the bezel region 1021 may be further reduced or omitted, and in response thereto, a design of applying the screen region 1201 having a greater size is also possible.

According to an embodiment, the housing 110 may include a first plate 111 including a first face (the rear face 110B) and a second face (not shown), which face away from each other, a first sidewall 1181 perpendicular to the first plate, a second sidewall 1182 perpendicular to the first plate 111, a third sidewall 1183 perpendicular to the first sidewall 1181 and the first plate 111 and parallel to the second sidewall 1182, and a fourth sidewall 1184 perpendicular to the first plate 111 and parallel to the first sidewall 1181. The housing 110 may include a recess (not shown) consisting of the first plate 111, the first sidewall 1181, the second sidewall 1182, the third sidewall 1183, and the fourth sidewall 1184. The recess may be a space which is concave in a z-axis direction. The rear face 110B (hereinafter, the first face) may be constructed by the first plate 111, and the bezel region 1021 and the side face 110C may be constructed by the first sidewall 1181, the second sidewall 1182, the third sidewall 1183, and the fourth sidewall 1184.

According to an embodiment, a structure consisting of the first sidewall 1181, the second sidewall 1182, the third sidewall 1183, and the fourth sidewall 1184 may be defined as a side member 118. The side member 118 may be constructed of various materials such as metal and/or polymer or the like.

According to an embodiment, the first plate 111 and at least part of the side member 118 may be constructed of an integral structure, and may include the same material. According to some embodiments, the first plate 111 may be constructed of a separate structure, and may be coupled with at least part of the side member 118.

The screen region 1201 may be smoothly coupled with the bezel region 1021, or in some embodiments, may be designed to protrude or not protrude with respect to the bezel region 1021.

According to an embodiment, the flexible display 120 may include a planar portion 122 extended to cover at least part of the recess and the bendable portion 121 located in the vicinity of the fourth sidewall 1184 and extended to the recess from the planar portion 122. When the flexible display 120 is moved from an open state 100b to a closed state 100a, at least part of the bendable portion 121 may be led out from the recess to construct substantially a plane between the planar portion 122 and the fourth sidewall 1184. FIG. 1A illustrates the closed state 100a in which at least part of the bendable portion 121 of the flexible display 120 is led out from the housing 110, and FIG. 1B illustrates the open state 100b in which at least part of the bendable portion 121 of the flexible display 120 is led into the housing 110. The flexible display 120 may include a periphery 123 extended along the first sidewall 1181. According to an embodiment, the periphery 123 may be located at a first distance from the first sidewall 1181 in the closed state 100a, and may be located at a second distance d2 longer than the first distance from the first sidewall 1181 in the open state. For example, there may be substantially no gap between the periphery 123 and the first sidewall 1181 in the closed state 100*a*, and the gap may be constructed between the periphery 123 and the first sidewall 1181 in the open state 100*b*.

In the closed state 100*a*, at least part of the bendable portion 121 and the planar portion 122 may construct the screen region 1201. In the open state 100*b*, the planar portion 122 of the bendable portion 121 and the planar portion 122 may constitute the screen region 1201, and the bendable portion 121 may be set to be disabled or inactive. In the open state 100*b*, at least part of the planar portion 122 may be selectively activated when there is a need to display an image.

According to an embodiment, the housing 110 may include an inner structure 140 extended from at least part of the first sidewall 1181, second sidewall 1182, and third sidewall 1183. The inner structure 140 may be disposed to be spaced apart from the first plate 111. The inner structure 140 may include a plate between the front side 110A and the rear side 110B, and the planar portion 122 of the flexible display 120 may be slidably coupled to the inner structure 140. The inner structure 140 may include a penetration portion (or opening) (not shown) corresponding to an access opening 110E, and the bendable portion 121 of the flexible display 120 may be moved through the penetration portion of the inner structure 140 when being led therein.

According to an embodiment, the electronic device 100 may include a support member (hereinafter, a second plate) (not shown) in a shape of a plate coupled to the planar portion 122 of the flexible display 120. The second plate may be disposed between the flexible display 120 and the inner structure 140 of the housing 110, and may be slidably coupled to the inner structure 140. Accordingly, the planar portion 122 of the flexible display 120 may be maintained to be flat by the second plate. When the planar portion 122 of the flexible display 120 is moved (e.g., translational motion) in a direction 1001 (hereinafter, a first direction) from the second sidewall 1182 to the first sidewall 1181 by external force caused by a finger or the like, the bendable portion 121 coupled to the planar portion 122 is led out from the housing 110 and thus becomes flat, and the electronic device 100 may be switched from the open state 100*b* to the closed state 100*a*. When the planar portion 122 of the flexible display 120 is moved in a second direction 1002 opposite to the first direction 1001 due to external force, at least part of the bendable portion 121 coupled to the planar portion 122 is led into the housing 110, and the electronic device 100 may be switched from the closed state 100*a* to the open state 100*b*.

According to an embodiment, when switched from the closed state 100*a* to the open state 100*b*, the bendable portion 121 of the flexible display 120 may be moved along a curved space (not shown) constructed inside the housing 110. When switched from the open state 100*b* to the closed state 100*a*, the bendable portion 121 of the flexible display 120 may be changed from a curved shape to a flat shape. A transfer structure or transfer device supporting sliding of the flexible display 120 may guide transfer and modification of the bendable portion 121 in the switching between the closed state 100*a* and the open state 100*b*.

According to various embodiments, a design in which the screen region 1201 is extended to a side portion 1184*c* of the electronic device 100 may also be possible. In this case, the access opening 110E may be constructed in the fourth frame 1184.

According to various embodiments, the flexible display 120 may be coupled or disposed adjacent to a touch sensing circuit, a pressure sensor capable of measuring touch strength (pressure), and/or a digitizer for detecting a magnetic-type stylus pen.

According to various embodiments, the electronic device 100 may include at least one of audio modules 103, 107, and 114, sensor modules 104 and 119, camera modules 105, 112, and 113, key input devices 117, an indicator 106, and connector holes 108 and 109. In some embodiments, the electronic device 100 may omit at least one (e.g., the key input devices 117 or the indicator 106) of these components, or other components may be additionally included.

The audio modules 103, 107, and 114 may include a microphone hole of module 103 or speaker holes of modules 107 and 114. A microphone for acquiring external sound may be disposed inside the microphone hole of module 103. In some embodiments, a plurality of microphones may be disposed to detect a direction of the sound. The speaker holes of modules 107 and 114 may include the external speaker hole of module 107 and the receiver hole of module 114 for a call. In some embodiments, the speaker holes of modules 107 and 114 and the microphone hole of module 103 may be implemented as one hole, or a speaker (e.g., a Piezo speaker) may be included without speaker holes. The speaker hole of module 107 and the microphone hole of module 103 may be constructed in the second frame 1182, but according to some embodiments, may be constructed in one of the first frame 1181, the third frame 1183, and the fourth frame 1184.

In an embodiment, referring to FIG. 1B, when switched from the closed state 100*a* to the open state 100*b*, a gap corresponding to the second distance d2 may be constructed between the first sidewall 1181 and the periphery 123 of the flexible display 120. The inner structure 140 may include a third face 110D facing away from the first face 110B, and part of the third face 110D may be exposed to the outside in the open state 100*b*. According to an embodiment, the electronic device 100 may include at least one electronic component which is hidden by the flexible display 120 in the closed state 100*a* and which is exposed to the outside through the gap between the first sidewall 1181 and the periphery 123 of the flexible display 120 in the open state 100*b*. According to an embodiment, an opening (not shown) may be constructed by penetrating the inner structure 140, and the opening may be exposed to the outside in the open state 100*b*.

According to an embodiment, the receiver hole of module 114 may be disposed on the third face 110D, and may be exposed to the outside so that it can be utilized in the open state 100*b*.

The sensor modules 104 and 119 may generate an electrical signal or data value corresponding to an internal operational state of the electronic device 100 or an external environmental state. According to an embodiment, the sensor modules 104 and 119 may include the first sensor module 104 (e.g., a proximity sensor) disposed on the third face 110D and the second sensor module 119 (e.g., a heart rate monitoring (HRM) sensor) disposed on the first face 110B of the housing 110. According to an embodiment, the first sensor module 104 disposed on the third face 110D may be exposed to the outside so that it can be utilized in the open state 100*b*. According to various embodiments, the electronic device 100 may further include a third sensor module (not shown) such as a fingerprint sensor disposed on the first face 110B. The electronic device 100 may further include at least one of senor modules (not shown), for example, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and an illuminance sensor (e.g., the first sensor module 104).

At least one sensor module (hereinafter, an optical sensor module) (e.g., the first sensor module 104) which utilizes light may include a light emitting portion and a light receiving portion. Light output from the light emitting portion (e.g., a light emitting diode (LED)) may be emitted to the outside, and light emitted to the outside may be reflected or scattered by an object. The light reflected or scattered from the object may be introduced to the light receiving unit, and the light receiving portion (e.g., a photodiode) may convert optical energy to electric energy. The light receiving portion may be electrically coupled to an analog to digital converter (ADC) or may include the ADC, and the ADC may convert the electric energy to a digital value. A control circuit (e.g., a processor) may acquire information regarding the object on the basis of the digital value acquired from the ADC.

According to an embodiment, both of the light emitting portion and light receiving portion of the optical sensor module may be disposed on the third face 110D. When switched from the closed state 100a to the open state 100b, the light emitting portion and light receiving portion of the optical sensor module may be exposed to the outside, and the control circuit may activate the light emitting portion and light receiving portion of the optical sensor module. According to an embodiment, the control circuit may selectively or optionally activate the optical sensor module on the basis of a user input and/or an executed application (e.g., a call application) in the open state 100b.

According to some embodiments, the light emitting portion of the optical sensor module may be disposed on the third face 110D, and the light receiving portion of the optical sensor module may be disposed under a rear face of the flexible display 120 or in the vicinity thereof. When switched from the closed state 100a and to the open state 100b, the light emitting portion of the optical sensor module may be exposed to the outside. According to an embodiment, when the proximity sensor has to be utilized based on a user input and/or an executed application in the open state 100b, light (e.g., a wavelength band including maximum sensitivity wavelength of 940 micrometer (μm) output from a light source of the light emitting portion may be emitted to the outside through a gap between the first sidewall 1181 and the periphery 123 of the flexible display 120, and the light emitted to the outside may be reflected or scattered by an object. The light reflected or scattered from the object may be introduced to the light emitting portion through the flexible display 120, and may generate a digital value in proportion to an amount of the introduced light. The control circuit (e.g., the processor) may determine a proximity distance of the object or whether the object is in the vicinity thereof on the basis of the digital value (hereinafter, a detection value) acquired from the light receiving portion. According to an embodiment, the control circuit may determine that the object is located within a proximity recognition distance if a detection value obtained from the light receiving portion is greater than or equal to a threshold which is a criterion for determining whether the object is in the vicinity thereof, and may determine that the object is located beyond the proximity recognition distance if the detection value obtained from the light receiving portion is less than the threshold. According to various embodiments, since the external light may be attenuated by the flexible display 120 when it is introduced to the light emitting portion of the proximity sensor, the threshold may be set to a lower value, as compared to an embodiment in which the light emitting portion of the proximity sensor is disposed on the third face 110D.

According to some embodiments, the light emitting portion and light receiving portion of the optical sensor module may be disposed under a rear face of the flexible display 120 both in the closed state 100a and the open state 100b. For example, when the proximity sensor has to be utilized based on a user input and/or an executed application in the closed state 100a or the open state 100b, light output from a light source of the light emitting portion may be emitted to the outside through the flexible display 120, and the light emitted to the outside may be reflected or scattered by an object. The light reflected or scattered from the object may be introduced to the light emitting portion through the flexible display 120, and may generate a digital value in proportion to an amount of the introduced light. According to an embodiment, since the light output from the light emitting portion of the light sensor module may be attenuated by the flexible display 120, light output power for driving the light emitting portion may be set to a higher value, as compared to an embodiment in which the light emitting portion of the proximity sensor is disposed on the third face 110D, thereby increasing intensity of light output from the light emitting portion. According to another embodiment, since the external light may be attenuated by the flexible display 120 when it is introduced to the light emitting portion of the proximity sensor, the threshold used as a criterion for determining whether it is in the vicinity thereof may be set to a lower value, as compared to the embodiment in which the light emitting portion of the proximity sensor is disposed on the third face 110D.

The camera modules 105, 112, and 113 may include the first camera module 105 disposed on the third face 110D, the second camera module 112 disposed on the first face 110B, and/or the flash 113. According to an embodiment, the first camera module 105 may be exposed to the outside so that it can be utilized when switched from the closed state 100a to the open state 100b. The camera module 105 and 112 may include one or more lenses, an image sensor, and/or an image signal processor (ISP). The flash 113 may include, for example, an LED or a xenon lamp. In some embodiments, two or more lenses (wide angle and telephoto lenses) and image sensors may be disposed on one face of the electronic device 100.

The key input devices 117 may include a home key button disposed on the housing 110, a touch pad disposed around the home key button, and/or the side key buttons 117 disposed on the side face 110C of the housing 110. In another embodiment, the electronic device 100 may not include some or all of the aforementioned key input devices. The key input devices which are not included, may be implemented on a display in a different form such as a soft key or the like.

According to an embodiment, the indicator 106 may be disposed on the third face 110C. The indicator 106 may provide, for example, state information of the electronic device 100 in an optical form, and may include an LED. The indicator 106 may be exposed to the outside so that it can be utilized when switched from the closed state 100a to the open state 100b.

The connector holes 108 and 109 may include the first connector hole 108 capable of accommodating a connector (e.g., a universal serial bus (USB) connector) for transmitting/receiving power and/or data of an external electronic device and/or the second connector hole (e.g., earphone jack) 109 capable of accommodating a connector for transmitting/receiving an audio signal with respect to the external electronic device. The connector holes 108 or 109 are disposed on the fourth sidewall 1184, but in some embodiments, may be disposed on one of the first sidewall 1181, the second sidewall 1182, and the third sidewall 1183.

According to various embodiments, the electronic device 100 may be designed to omit at least one of the receiver hole of module 114, the first sensor module 104, the camera module 105, and the indicator 106, or to include various other elements disposed on the third face 110D.

Figure 3:
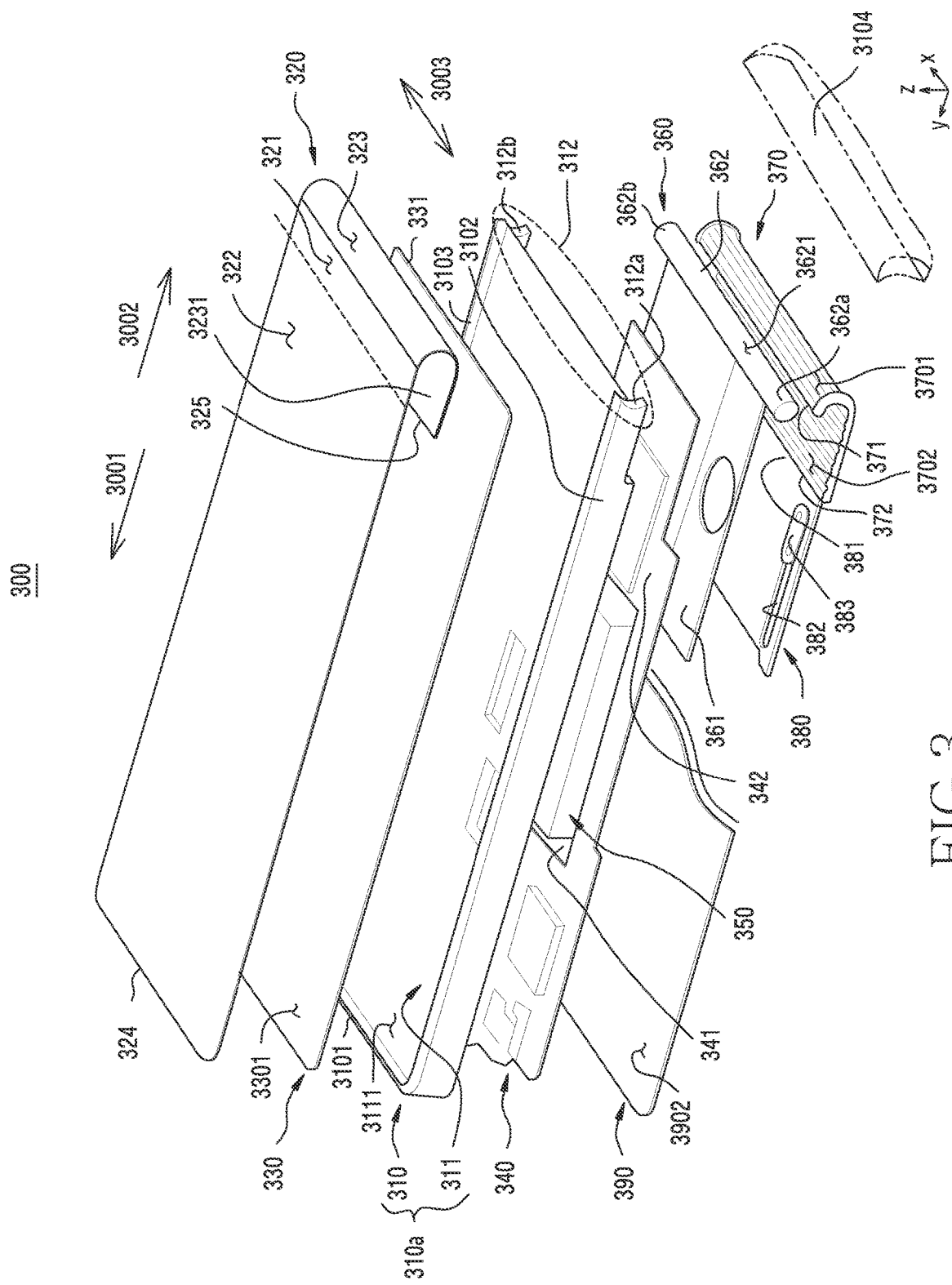
FIG. 3 is an exploded perspective view of an electronic device including a movable flexible display according to an embodiment of the disclosure.
Figure 4A:
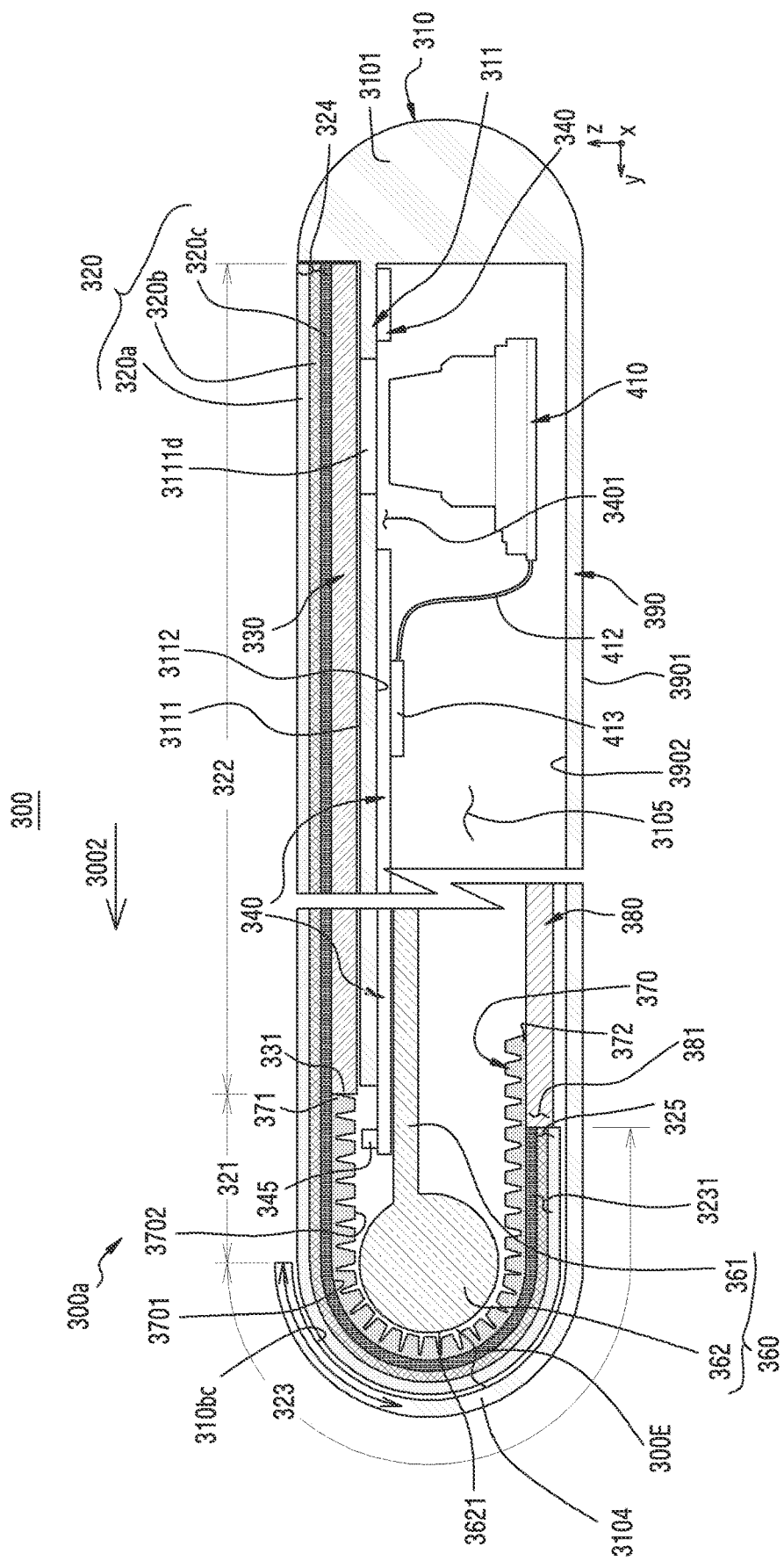
FIG. 4A is a cross-sectional view for a closed state of an electronic device including a movable flexible display according to an embodiment of the disclosure.
Figure 4B:
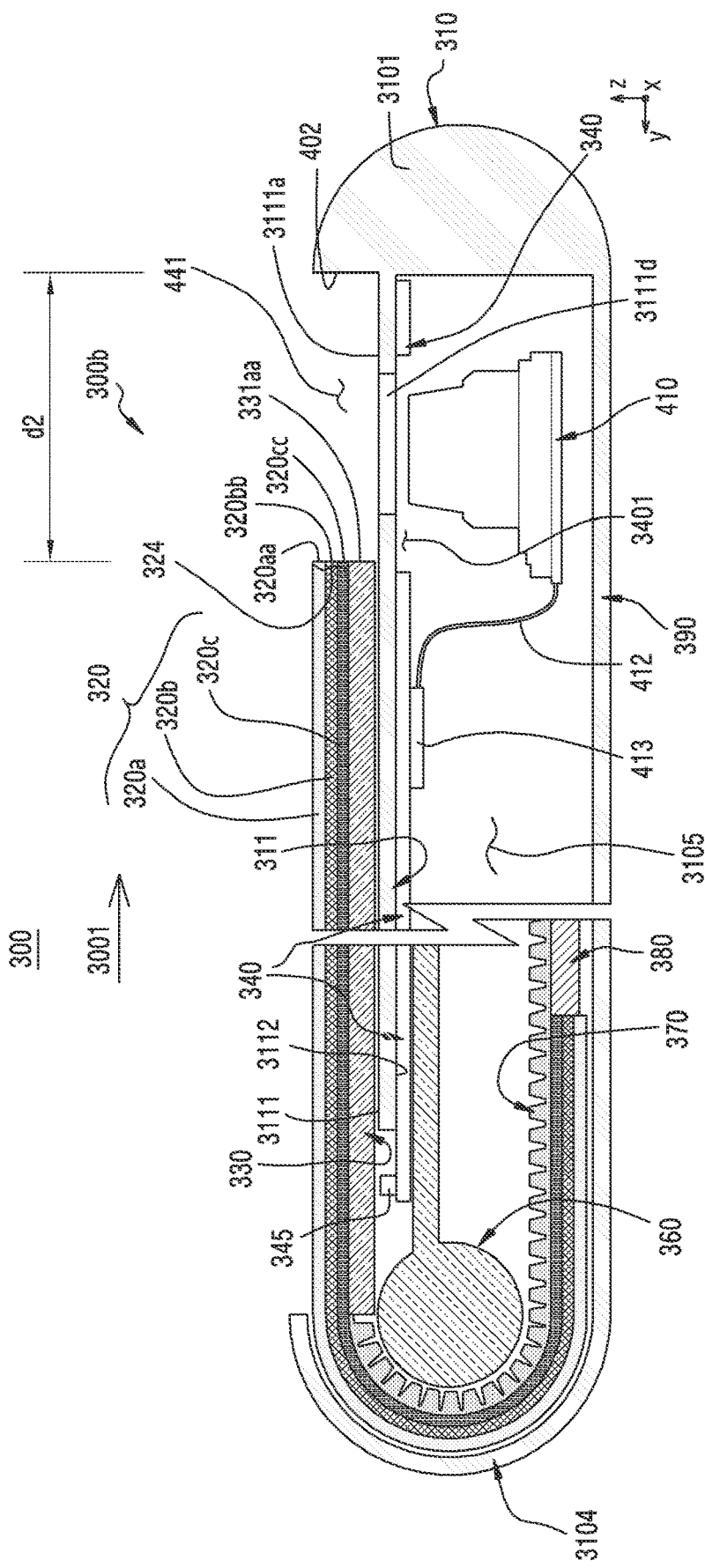
FIG. 4B is a cross-sectional view for an open state of the electronic device of FIG. 4A according to an embodiment of the disclosure.

FIG. 3 is an exploded perspective view of an electronic device including a movable flexible display according to an embodiment of the disclosure. FIG. 4A is a cross-sectional view for a closed state of an electronic device including a movable flexible display according to an embodiment of the disclosure. FIG. 4B is a cross-sectional view for an open state of the electronic device of FIG. 4A according to an embodiment of the disclosure.

Referring to FIGS. 3, 4A, and 4B, an electronic device 300 may include a first plate 390, a side member 310, an inner structure 311, a flexible display 320, a second plate 330, a printed circuit board 340, a battery 350, a support structure 360, a flexible plate 370, and a third plate 380. At least one of the components of the electronic device 300 may be identical or similar to components of the electronic device 100 of FIG. 1A, 1B, or 2 and thus, redundant descriptions will be omitted.

The first plate 390 (e.g., 111 of FIG. 1B) may include a first face 3901 and a second face 3902 facing away from the first face 3901. The first face 3901 may construct a rear face (e.g., 110B of FIG. 1B) of the electronic device 300.

The side member 310 (e.g., 118 of FIG. 1A) may include a first sidewall 3101 (e.g., 1181 of FIG. 1A) perpendicular to the first plate 390, a second sidewall 3102 (e.g., 1182 of FIG. 1A) perpendicular to the first sidewall 3101 and the first plate 390, a third sidewall 3103 (e.g., 1183 of FIG. 1A) perpendicular to the first sidewall 3101 and the first plate 390 and parallel to the second sidewall 3102, and a fourth sidewall 3104 (e.g., 1184 of FIG. 1A) perpendicular to the first plate 390 and parallel to the first sidewall 3101. The side member 310 may be coupled with the first plate 390, and may have a recess 3105 consisting of the first plate 390, the first sidewall 3101, the second sidewall 3102, the third sidewall 3103, and the fourth sidewall 3104. The side member 310 may be constructed of a structure separated from the first plate 390. According to some embodiments, the side member 310 may be constructed of a structure integral with the first plate 390.

According to an embodiment, the fourth sidewall 3104 may be constructed separately from the first sidewall 3101, second sidewall 3102, and third sidewall 3103 of the side member 310.

The inner structure 311 (e.g., 140 of FIG. 1B) may be extended from at least part of the first sidewall 3101, second sidewall 3102, and third sidewall 3103. The inner structure 311 may be disposed to be spaced apart from the second face 3902 of the first plate 390. According to an embodiment, the inner structure 311 may be constructed integrally with the side member 310. According to some embodiments, the inner structure 311 may be constructed separately from the side member 310. For example, the inner structure 311 and the side member 310 may be constructed as an integral structure 310a with an identical material such as metal and/or non-metal (e.g., polymer) or the like. According to an embodiment, the inner structure 311 may include a third face 3111 (e.g., 1111 of FIG. 1B) facing away from the second face of the first plate 390 and a fourth face 3112 facing away from the third face 3111 (e.g., 1111 of FIG. 1B). The second plate 330 may be slidably coupled to the third face 3111, and the printed circuit board 340 may be coupled to the fourth face 3112.

According to an embodiment, the flexible display 320 may include a planar portion 322 (e.g., 122 of FIG. 1A) extended to cover at least part of the recess 3105 and bendable portions 321 and 323 (e.g., 121 of FIG. 1A) located in the vicinity of the fourth sidewall 3104 and extended to the recess 3105 from the planar portion 322. Referring to FIG. 4A and FIG. 4B, when the flexible display 320 is moved from an open state 300b to a closed state 300a, the bendable portion 321 of the bendable portions 321 and 323 may be led out from the recess to construct substantially a plane between the planar portion 322 and the fourth sidewall 3104. The flexible display 320 may include an end (or a periphery) 324 extended along the first sidewall 3101. According to an embodiment, the periphery 324 may be located at a first distance from the first sidewall 3101 in the closed state 300a, and may be located at a second distance d2 longer than the first distance from the first sidewall 3101 in the open state 300b. For example, there may be substantially no gap between the periphery 324 and the first sidewall 3101 in the closed state 300a, and the gap may be constructed between the periphery 324 and the first sidewall 3101 in the open state 300b.

The second plate 330 may be disposed between the inner structure 311 and the planar portion 322 of the flexible display 320, and may be slidably coupled to the inner structure 311. The second plate 330 may be a rigid plate, and the planar portion 322 (e.g., 122 of FIG. 1A) of the flexible display 320 may be maintained to be flat by the second plate 330. For example, a face 3301 of the second plate 330 to be coupled with the planar portion 322 of the flexible display 320 may be substantially a plane.

When the planar portion 322 of the flexible display 320 is moved in a second direction 3002 (e.g., 1002 of FIG. 1A) by external force, the bendable portion 321 of the bendable portions 321 and 323 coupled to the planar portion 322 may be led into an inner space (e.g., the recess 3105) of the electronic device 300, and may be switched from the closed state 300a to the open state 300b. When the planar portion 322 of the flexible display 320 is moved (e.g., translational motion) in a first direction 3001 (e.g., 1001 of FIG. 1B) by external force, the bendable portion 321 of the bendable portions 321 and 323 coupled to the planar portion 322 may be led out from the electronic device 300, and may be switched from the open state 300b to the closed state 300a.

According to some embodiments, the second plate may be constructed in a curved shape, and the planar portion 322 of the flexible display 320 coupled thereto may be maintained to be a curved shape. For example, the third face 3111 of the inner structure 311 may include a curved face corresponding to a curved second plate, and may be designed such that the second plate is slid on this curved face.

Referring to FIG. 4A and FIG. 4B, the flexible display 320 may have a structure in which a light-transmitting plate 320a, a panel 320b, and a substrate 320c are laminated. The light-transmitting plate 320a may be constructed of an organic material such as polyimide, and may have flexibility. Although not shown, the panel 320b may include a thin film transistor (TFT) and a light emitting layer which constructs a plurality of pixels controlled by the TFT. The TFT may be disposed between the light emitting layer and the substrate, and layers included in the TFT may be constructed on the substrate 320c through a series of processes such as deposition, pattering, etching, or the like. The TFT may include an active layer (or a semiconductor layer) constructed of a semi-conductive material such as poly-silicon and a gate electrode for driving the active layer, a source electrode, and a drain electrode. The active layer may be electrically coupled to the source electrode and the drain electrode, and may be a path (or a channel) which enables electrons to move such as a conductor when voltage of at least a specific level is applied to the gate electrode.

According to an embodiment, the light emitting layer of the panel 320b may include an organic light emitting diode (OLED), and although not shown, may include an anode, cathode, and organic material layer constructed on the TFT through evaporation. The anode is an electrode which emits a hole. The cathode is an electrode which emits an electron. The organic material layer may be disposed between the anode and the cathode. Due to a response of the active layer of the TFT, current may flow to the source electrode, the active layer, and the drain electrode, and voltage may be applied to the anode and cathode of the light emitting layer electrically coupled to the TFT. Accordingly, the electron emitted from the anode and the hole emitted from the cathode may be coupled in the organic material layer, and exciton energy caused by the coupling of the electron and the hole may be emitted in a form of light in the organic material layer. The light emitting layer including the OLED may be defined as an 'organic light emitting layer'.

According to an embodiment, a TFT of the panel 320b may be a low-temperature polycrystalline silicon (LTPS)-based TFT. According to some embodiments, the TFT may be an amorphous silicon (a-Si)-based TFT.

According to an embodiment, the substrate 320c may serve as a support for the flexible display 320. According to some embodiments, a structure including the substrate 320c and the TFT of the panel 320b may be defined as a backplane (or a backplane substrate). The backplane may be constructed of a material, for example, an organic material, having a property of flexibility, a low coefficient of thermal expansion (CTE), or the like. According to an embodiment, the backplane may be a plastic constructed of an organic material such as polyimide.

Referring to FIG. 4B, in an embodiment, a side face 320aa of the light-transmitting plate 320a, a side face 320bb of the panel 320b, and a side face 320cc of the substrate 320c, which constitute the periphery 324 of the flexible display 320, and a side face 331aa of the second plate 330 may be generally aligned. According to some embodiments, one side face of the side face 320aa of the light-transmitting plate 320a, the side face 320bb of the panel 320b, the side face 320cc of the substrate 320c, which constitute the periphery 324 of the flexible display 320, and the side face 331aa of the second plate 330 may protrude more in the first direction 3001, as compared to another side face.

According to some embodiments, the light-transmitting plate 320a or the substrate 320c may be designed to surround the side face 320bb of the panel 320b, so that a light emitting layer of the panel 320b is not affected by the outside. For example, since the organic material layer, anode, or cathode included in the light emitting layer of the panel 320b may lose its luminescent property by reacting (e.g., oxidizing) with oxygen or moisture, a structure in which the light transmitting plate 320a or the substrate 320c surrounds the side face 320bb of the panel 320b can prevent oxygen or moisture from penetrating into the light emitting layer as a seal which prevents the light emitting layer from being exposed to the outside. According to some embodiments, the panel 320b may include encapsulation (e.g., thin film encapsulation (TFE)) to prevent oxygen or moisture from penetrating into the light emitting layer, and a structure in which the light-transmitting plate 320a or the substrate 320c surrounds the side face 320bb of the panel 320b may be omitted or additionally constructed.

According to an embodiment, the flexible display 320 may include a touch sensor. The touch sensor may be included in or coupled with the light-transmitting plate 320a, the panel 320b, or the substrate 320c. According to an embodiment, the touch sensor may be included inside the panel 320b, and may be disposed, for example, on an encapsulation of the panel 320b. The flexible display 320 including the touch sensor may be defined as a 'flexible touchscreen display' or a 'flexible touchscreen layer'.

According to various embodiments, the flexible display 320 may include a phase retardation layer (or retarder) disposed above the light emitting layer and a polarizing layer (or polarizer) disposed above the phase retardation layer. When non-polarized light such as solar light travels to the flexible display 320, the non-polarized light passes through the polarizing layer and changes to linearly polarized light. The linearly polarized light may change to circularly polarized light through the phase retardation layer. For example, the non-polarized light may change to 90° linearly polarized light upon passing through a polarizing layer of 90°, and the linearly polarized light may change to 135° circularly polarized light upon passing through a 45° phase retardation layer. The 135° circularly polarized light may have a value in the middle of 90° and 180° which is a linearly polarized axis, and may oscillate in an x-axis and a y-axis, that is, with both of phases of 90° and 180°. The circularly polarized light may not be placed on a specific axis, and the axis may be changed with an equal amplitude. According to an embodiment, the phase retardation layer may have a characteristic of a quarter wave retarder ($\lambda/4$ retarder). According to an embodiment, when sunlight is incident on the flexible display 320, most of the light may be reflected on electrodes included in the flexible display 320, which may cause difficulty in screen recognition. The polarizing layer and the phase retardation layer may prevent light coming from outside from being reflected, thereby improving outdoor visibility. For example, the 135° circularly polarized light changed by the phase retardation layer is reflected on the TFT, and is changed into the 180° linearly polarized light through the phase retardation layer. The 180° linearly polarized light cannot be emitted to the outside through the 90° polarizing layer. According to some embodiments, one layer in which the polarizing layer and the phase retardation layer are combined may be provided, and this layer may be defined as a circular polarizing layer. In addition, the flexible display 320 may further include various layers (not shown).

Referring to FIGS. 4A and 4B, when switched from the closed state 300a to the open state 300b, a gap 441 may be constructed between one face 402 of the first sidewall 3101 and the periphery 324 of the flexible display 320, and a portion 3111a of the third face 3111 (e.g., 110D of FIG. 1B) of the inner structure 311 may be exposed to the outside through the gap 441. According to an embodiment, the electronic device 300 may include at least one electronic component which is hidden by the flexible display 320 in the closed state 300a and which is exposed to the outside through the gap 441 between the first sidewall 3101 and the periphery 324 of the flexible display 320 in the open state 300b. According to an embodiment, an opening 3111d may be constructed by penetrating the inner structure 311, and at least one electronic component may be exposed through the opening 3111d.

An electronic component which utilizes the portion 3111a of the third face 3111 may include one or more of a receiver hole of (e.g., module 114 of FIG. 1B), a sensor module (e.g., the first sensor module 104 of FIG. 1B), a camera module 410 (e.g., the first camera module 105 of FIG. 1B), an indicator (e.g., 106 of FIG. 1B) or the like. In an embodiment, external light may be introduced to the camera module 410 through the opening 3111d. According to various embodiments, a light-transmitting material replaced for the opening 3111d or coupled to opening 3111d may be disposed.

According to an embodiment, a connector 413 extended from the camera module 410 by using a flexible printed circuit board (FPCB) 412 may be electrically coupled to the printed circuit board 340.

According to various embodiments, the camera module 410 may be laterally surrounded at least partially by the printed circuit board 340. For example, the printed circuit board 340 may include an opening 3401, and the camera module 410 may be disposed in the opening 3401.

According to various embodiments, various electronic components other than the camera module 410 may be designed to utilize the portion 3111d of the third face 3111. For example, the portion 3111d of the third face 3111 may be utilized by various other elements such as various light emitting devices (e.g., the indicator 106, or the light emitting portion of the proximity sensor 104) such as an LED or the like, a light receiving device (e.g., a light receiving portion of the proximity sensor) for converting optical energy to electrical energy, a sound input device (e.g., a microphone) for converting sound to electrical signals, or the like.

The printed circuit board 340 may be disposed between the inner structure 311 and the first plate 390. The printed circuit board 340 may be coupled to the inner structure 311 by utilizing a joining means such as bolt joining, snap-fits, or the like. A processor, a memory, and/or an interface may be placed on the printed circuit board 340. The processor may include, for example, one or more of a central processing unit, an application processor, a graphic processing unit, an ISP, a sensor hub processor, and a communication processor (CP). The memory may include, for example, a volatile memory or a non-volatile memory. The interface may include, for example, a high-definition multimedia interface (HDMI), a USB interface, a secure digital (SD) card interface, and/or an audio interface. The interface may electrically or physically couple, for example, the electronic device 300 with an external electronic device, and may include a USB connector, an SD card/multimedia card (MMC) connector, or an audio connector.

The battery 350 may be a device for supplying power to at least one component of the electronic device 300, and may include, for example, a primary cell which is not rechargeable, a secondary cell which is rechargeable, or a fuel cell. At least part of the battery 350 may be disposed, for example, to be substantially co-planar with the printed circuit board 340. The battery 350 may be disposed inside the electronic device 300, and according to some embodiments, may be disposed to be detachable from the electronic device 300. According to an embodiment, the battery 350 may be disposed between the inner structure 311 and the first plate 390, and the battery 350 may be laterally surrounded at least partially by the printed circuit board 340. For example, a space 341 which is not occupied by the printed circuit board 340 may be present between the inner structure 311 and the first plate 390, and the battery 350 may be disposed in the space 341. The battery 350 may be electrically coupled to the printed circuit board 340 by using an FPCB or the like.

Referring again to FIG. 3, the support structure 360 may be disposed inside the electronic device 300, and may be coupled with the inner structure 311. According to an embodiment, the support structure 360 may include a plate portion 361 and a shaft portion 362 coupled to the plate portion 361. A portion 342 of the printed circuit board 340 may be disposed between the inner structure 311 and the plate portion 361 of the support structure 360, and may be coupled with the inner structure 311 together with the plate portion 361 of the support structure 360 by using a bolt. The shaft portion 362 may have, for example, a shape of a cylinder with a length extended in a direction 3003 (hereinafter, a third direction) perpendicular to the first direction 3001, generally as a shape including a generally curved face. The shaft portion 362 may guide or support the flexible plate 370 and the bendable portions 321 and 322 of the flexible display 320 coupled with the flexible plate 370 so as to move them with a certain radius. According to an embodiment, when the plate portion 361 is coupled with the support structure 311, the shaft portion 362 may be coupled to one side 312 of the structure 310a (hereinafter, a first structure) constructed of the side member 310 and the inner structure 311.

According to an embodiment, the second sidewall 3102 and third sidewall 3103 of the side member 310, which face each other, may include concave portions 312a and 312b at ends thereof. One pair of the concave portions 312a and 312b may have a concave curved face in the first direction 3001 so as to be engaged with a convex curved portion 3621 of the shaft portion 362 of the support structure 360. When the plate portion 361 of the support structure 360 is coupled with the inner structure 311, both sides 362a and 362b of the shaft portion 362 may be coupled to the pair of concave portions 312a and 312b, and the shaft portion 262 may surround the inner structure 311 together with three sidewalls 3101, 3102, and 3103.

According to some embodiments, the shaft portion 362 of the support structure 360 may be designed to be rotatable when the flexible plate 370 and the bendable portions 321 and 323 of the flexible display 320 coupled with the flexible display 370 move with a specific radius.

According to some embodiments, the flexible plate 370 may be designed to include a plurality of rollers. These rollers may roll on a corresponding face (e.g., the curved face 3621 of the shaft portion 362 and an inner curved face 310bc of the fourth sidewall 3104) when the bendable portions 321 and 323 of the flexible display 320 coupled with the flexible plate 370 move with a specific radius.

Referring to FIG. 4A, in an embodiment, the fourth sidewall 3104 may provide the curved inner face 310bc corresponding to part of the curved face 3621 of the shaft portion 362. Accordingly, a convex curved space 300E may be constructed between the shaft portion 362 and the fourth sidewall 3104 in the second direction 3002. According to an embodiment, when the planar portion 322 of the flexible display 320 translationally moves in the second direction 3002, the bendable portions 321 and 323 of the flexible display 320 may be guided to the curved space 300E and thus may be moved into the electronic device 300.

The fourth sidewall 3104 may be designed to be detachable from the first structure 310a, or in some embodiments, may be constructed integrally with the side member 310 or the inner structure 311.

According to various embodiments, although not shown, it may be designed such that at least part of the fourth sidewall 3104 is removed to provide a larger screen. The fourth sidewall 3104 may include a first side (not shown) coupled to the first plate 390 and a second side (not shown) extended from the first side. Accordingly, the curved space 300E may be constructed to guide movement of the bendable portions 321 and 323 of the flexible display 320. The screen may correspond to a region exposed to the outside between the first sidewall 3101 and the second side of the fourth sidewall 3104 in the flexible display 320. For example, the bendable portion 321 of the planar portion 322 and bendable portions 321 and 323 of the flexible display 320 may constitute the screen in the closed state 300a, and the planar portion 322 of the flexible display 320 may constitute the screen in the open state 300b. According to an embodiment, at least the portion 310bc extended from the second side to the first side along the flexible plate 370 may be omitted in the fourth sidewall 3104, thereby constructing an electronic device of which a screen is further extended. For example, when a portion of the fourth sidewall 3104 is omitted, the screen may include a flat screen region constructing a front face of the electronic device 300 and a curved screen region constructing a side face of the electronic device 300. The portion 310bc which can be omitted in the fourth sidewall 3104 is not limited to the range shown in FIG. 4A, and may be designed in a different range.

According to an embodiment, the bendable portions 321 and 323 of the flexible display 320 may include the first region of bendable portion 321, which is led into the recess 3105 in the closed state 300a and led out from the outside of the recess 3105 in the open state 300b, and the second region of bendable portion 323 extended from the first region of bendable portion 321 to the curved space 300E. The second region of bendable portion 323 may include a second end 325 of the flexible display 320, and the second end 325 may be disposed between the first plate 390 and the plate portion 361 of the support structure 360. When switched from the closed state 300a to the open state 300b, the first end (or a periphery) 324 of the flexible display 320 may be moved in the second direction 3002, and the second end 325 of the flexible display 320 may be moved in the first direction 3001. When switched from the open state 300b to the closed state 300a, the first end 324 of the flexible display 320 may be moved in the first direction 3001, and the second end 325 of the flexible display 320 may be moved in the second direction 3002. According to an embodiment, when switched between the closed state 300a and the open state 300b, a distance by which the first end 324 is moved may be substantially the same as a distance by which the second end 325 is moved.

According to an embodiment, a display drive related element (hereinafter, a display drive element) (not shown) such as a display drive integrated circuit (DDI) may be placed in a location 3231 disposed between the first plate 390 and the plate portion 361 of the support construction 360 in the second region of bendable portion 323 of the bendable portions 321 and 323. The display drive element may be electrically coupled to the printed circuit board 340 by using a flexible coupling means such as an FPCB.

According to an embodiment, the second region of bendable portion 323 of the bendable portions 321 and 323 may have a structure in which the light-transmitting plate 320a, the panel 320b, and the substrate 320c are included, similarly to the planar portion 322 and the first region of bendable portion 321 of the bendable portions 321 and 323. According to some embodiments, the second region of bendable portion 323 of the bendable portions 321 and 323 may be designed as a structure in which the panel and the substrate are included among the light-transmitting plate, the panel, and the substrate, or a structure in which the substrate is included among the light-transmitting plate, the panel, and the substrate.

According to an embodiment, the flexible plate 370 may be coupled to a rear face of the bendable portions 321 and 323 of the flexible display 320, and may be moved along the curved space 300E when switching between the closed state 300a and the open state 300b.

When the planar portion 322 of the flexible display 320 coupled with the second plate 330 is moved in the second direction 3002, the flexible plate 370 may be movable along the curved space 300E while the bendable portions 321 and 323 of the flexible display 320 maintain a smooth shape without being modified to be embossed. In addition, the flexible plate 370 may be configured such that a substantially smooth shape is maintained between the planar portion 322 of the flexible display 320 coupled with the second plate 330 and the bendable portions 321 and 323 of the flexible display 320 coupled with the flexible plate 370.

The flexible plate 370 may have a generally rectangular shape extended from a third end 371 to a fourth end 372 when viewed in a plan view. According to an embodiment, one face 3701 of the flexible plate 370 coupled with the flexible display 320 may be substantially flat, and another face 3702 of the flexible plate 370 may include a structure in which concavity and convexity are regularly arranged along a length extended from the third end 371 to the fourth end 372. The other face 3702 of the concave-convex structure may allow the flexible plate 370 to be easily bent in a curved shape. In addition, the other face 3702 of the concave-convex structure may reduce a friction area for the shaft portion 362 of the support structure 360, and thus the flexible plate 370 may be easily slid with respect to the shaft portion 362. The flexible plate 370 having this shape may be defined as a flexible track. According to various embodiments, the flexible plate 370 may be constructed of a material capable of reducing frictional force of the curved face 3621 of the shaft 362 and the inner curved face 310bc of the fourth sidewall 3104, or the face 3702 of the concave-convex structure may be subjected to surface processing to reduce the frictional force. In addition, various forms of flexible members capable of replacing the flexible plate 370 may also be designed. For example, a flexible member (e.g., a multi-bar) in a form in which a plurality of shafts are coupled may replace the flexible plate 370. As another example, a plate in a form in which both sides are flat may be utilized in place of the flexible plate. As still another example, in place of the flexible plate 370, a plate in which a plurality of layers are laminated may be utilized, or a constituent material, thickness, or the like of each layer may be designed to have a desired mechanical property (e.g., elastic modulus, tensile strength, etc.).

The face 3702 of the concave-convex structure may improve a constraint on a material for constituting the flexible plate 370. For example, the flexible plate 370 having the face 3702 of the concave-convex structure may be constructed of a material capable of securing tenacity, as compared to a flexible plate of which both sides are generally flat. The flexible plate 370 having the designed tenacity may not be substantially shrunk or tensioned by force delivered when the second plate 330 coupled with the planar portion 322 of the flexible display 320 is moved in the first direction 3001 or the second direction 3002.

According to an embodiment, it may be designed such that there is substantially no gap between an end 331 of the second plate 330 and flexible plate 370 coupled to the rear face of the flexible display 320. Accordingly, when the second plate 330 is moved in the second direction 3002, force based thereon may be delivered directly to the flexible plate 370.

According to an embodiment, the ends 331 and 371 of the second plate 330 and flexible plate 370 coupled to the rear face of the flexible display 320 may be coupled using an adhesive or the like. Accordingly, when the second plate 330 is moved in the first direction 3001, force based thereon may be delivered directly to the flexible plate 370.

According to an embodiment, the third plate 380 is slidably coupled to the first plate 390, and may be disposed between the first plate 390 and the plate portion 361 of the support structure 360. The third plate 380 may include a groove 382 having a length extended in the first direction 3001 or the second direction 3002 and a fixing member 383 such as a pin coupled to the first plate 390 by penetrating the groove 382. The third plate 380 may be guided to the groove 382 corresponding to the fixing member 383 so as to be moved in the first direction 3001 while maintaining a state of being coupled with the first plate 390 by means of the fixing member 383. When switching between the closed state 300a and the open state 300b, the third plate 380 may facilitate the flexible display 320 and the flexible plate 370 to maintain a 'U' shape which is convex in the second direction 3002.

According to various embodiments, although not shown, in a state where the external force applied to the flexible display 320 is released, when the third plate 380 is in a third position between a first position corresponding to the closed state 300a and a second position corresponding to the open state 300b, a device (e.g., a position adjusting device) may be further included to automatically move the third plate 380 to the first position or the second position. For example, a hinge structure (e.g., a sliding hinge or a sliding actuator) may be included between the third plate 380 and the first plate 390, and the hinge structure may enable a semi-automatic operation when switching between the closed state 300a and the open state 300b and may elastically support the third plate 380 so that the closed state 300a or the open state 300b can be maintained. The semi-automatic operation may include an operation of automatically moving the flexible display 320 to a position of the closed state 300a without external force when the flexible display 320 is moved in the first direction 3001 to some extent. The semi-automatic operation may include an operation of automatically moving the flexible display 320 to the position of the open state 300b without external force when the flexible display 320 is moved in the second direction 3002 to some extent. The hinge structure between the third plate 380 and the first plate 390 may elastically support the semi-automatic operation of the third plate 380 by using an elastic member such as a torsion spring. According to some embodiments, the hinge structure which supports the semi-automatic operation may be applied between the second plate 330 and the inner structure 311, or between the inner structure 311 and the side member 310. Various other position adjusting devices may be designed in addition to the hinge structure.

According to an embodiment, one end 381 of the third plate 380 may be coupled with the second end 325 of the flexible display 320. Accordingly, the flexible display 320 and the third plate 380 may be moved together, and the second end 325 of the flexible display 320 may be moved in the first direction 3001 or the second direction 3002 without being lifted. According to an embodiment, the flexible plate 370 may cover at least part of the third plate 380, and may be designed to have an extended size to be coupled therewith.

According to various embodiments, the electronic device 300 may include at least one sensor for acquiring information (e.g., a sliding amount or a distance) regarding switching between the closed state 300a and the open state 300b, movement of the flexible display 320, movement of the second plate 330, movement of the flexible plate 370, or movement of the third plate 380. According to an embodiment, such a sensor 345 may be mounted on the printed circuit board 340 or may be placed at a position separated from the printed circuit board 340, and may be electrically coupled with the printed circuit board 340 by using an element such as an FPCB or the like.

A control circuit (e.g., a processor) of the electronic device 300 may perform various operations on the basis of information acquired from the sensor 345. According to an embodiment, upon detecting the open state 300b by using the sensor 345, the processor may selectively activate at least part of the planar portion 322 of the planar portion 322 and bendable portions 321 and 323 of the flexible display 320 when there is a need to display an image. According to an embodiment, upon detecting the closed state 300a by using the sensor 345, the processor may selectively activate at least part of the first region of bendable portion 321 of the planar portion 322 and bendable portions 321 and 323 of the flexible display 320 when there is a need to display an image. According to an embodiment, the processor may selectively activate at least part of the first region of bendable portion 321 of the planar portion 322 and the bendable portions 321 and 323 on the basis of a user input and/or an executed application (e.g., a call application).

According to various embodiments, in case of a structure in which the bendable portion 323 of the bendable portions 321 and 323 includes the panel 320b and the substrate 320c, the processor may set the second region of bendable portion 323 of the bendable portion 321 and 323 to be disabled or inactive irrespective of the closed state 300a and the open state 300b.

According to an embodiment, upon detecting the open state 300b by using the sensor 345, the processor may selectively or optionally activate at least one electronic component (e.g., the camera module 410) which utilizes the portion 3111a of the third face 3111 on the basis of a user input and/or an executed application (e.g., a call application).

According to various embodiments, the electronic device 300 may include an antenna (not shown) disposed at various positions. According to an embodiment, the antenna may be disposed between the first plate 390 and the battery 350. The antenna may include, for example, a near field communication (NFC) antenna, a wireless charging antenna, and/or a magnetic secure transmission (MST) antenna. The antenna may perform short-range communication, for example, with the external electronic device, or may wirelessly transmit/receive power required for charging. In another embodiment, an antenna structure may be constructed by at least part of the side member 310 and/or the inner structure 311 or a combination thereof.

According to various embodiments, the electronic device 300 may further include various elements (or modules) depending on a type of providing them. The components may be modified in various manners along with the convergence trend of digital devices, and thus not all of the components may be listed herein. However, components of the same level as that of the aforementioned components may be further included in the electronic device 300. In the electronic device 300 according to various embodiments, it is apparent that specific components may be excluded from the aforementioned components or replaced with other components.

Figure 5A:
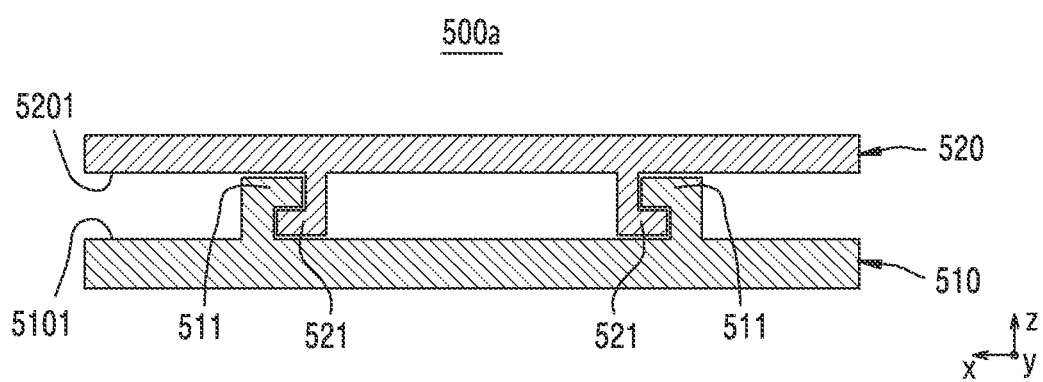
FIG. 5A is a cross-sectional view for a sliding structure between two members according to various embodiments of the disclosure.
Figure 5B:
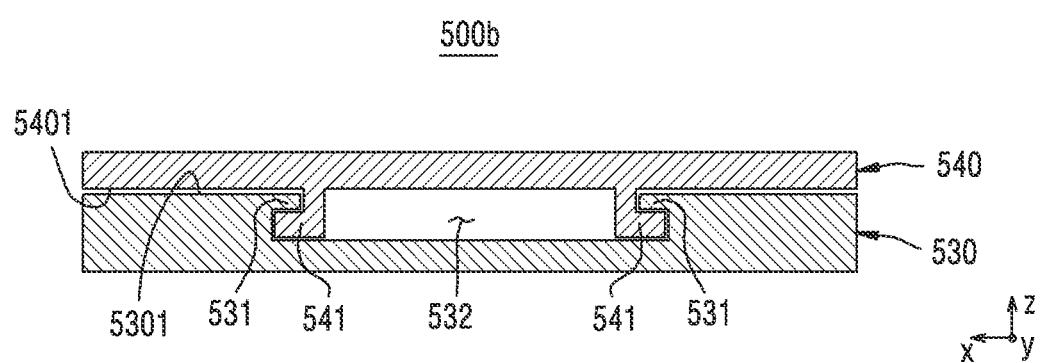
FIG. 5B is a cross-sectional view for a sliding structure between two members according to various embodiments of the disclosure.
Figure 5C:
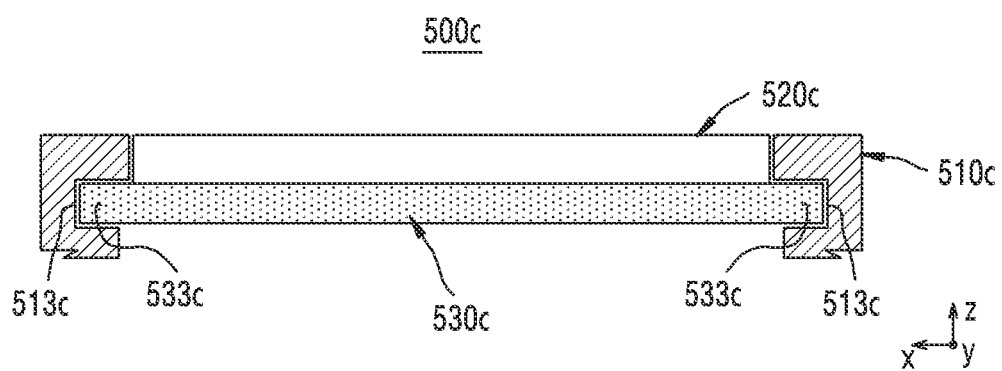
FIG. 5C is a cross-sectional view for a sliding structure between two members according to various embodiments of the disclosure.

FIGS. 5A, 5B, and 5C are cross-sectional views for a sliding structure between two members according to various embodiments of the disclosure.

Referring to FIG. 5A, an eleventh plate 510 may include a pair of first rails 511 constructed to protrude from one face 5101 facing a twelfth plate 520. The pair of first rails 511 may be arranged in an x-axis direction (e.g., the third direction 3003 of FIG. 3) in a shape bent in opposite directions and may have a length extended in a y-axis direction (e.g., the first direction 3001 or second direction 3002 of FIG. 3). The twelfth plate 520 may include a pair of second rails 521 constructed to protrude from one face 5201 facing the eleventh plate 510. The pair of second rails 521 may be arranged in the x-axis direction in a shape bent in opposite directions, and may have a length extended in the y-axis direction. When the pair of second rails 521 and the pair of first rails 511 are coupled as shown in FIG. 5A, the twelfth plate 520 may not be easily separated in a z-axis direction (e.g., a direction perpendicular to the second region of bendable portion 323 of FIG. 3) from the eleventh plate 510, and may be in a state of being slidable in the y-axis direction with respect to the eleventh plate 510. According to an embodiment, the eleventh plate 510 may be the inner structure 311 of FIG. 3, and the twelfth plate 520 may be the second plate 330 of FIG. 3. Referring back to FIG. 3, the second plate 330 (e.g., the twelfth plate 520) may be coupled to the inner structure 311 (e.g., the eleventh plate 510) by being led in through one side 312 of the first structure 310a. According to some embodiments, the eleventh plate 510 may be the second plate 330 of FIG. 3, and the twelfth plate 520 may be the inner structure 311 of FIG. 3.

Referring to FIG. 5B, a fourteenth plate 540 may include a pair of rails 541 constructed to protrude from one face 5401 facing a thirteenth plate 530. The pair of rails 541 may be arranged in the x-axis direction (e.g., the third direction 3003 of FIG. 3) in a shape bent in opposite directions, and may have a length extended in the y-axis direction (e.g., the first direction 3001 or second direction 3002 of FIG. 3). The thirteenth plate 530 may include a space 532 which accommodates the pair of rails 541 on one face 5301 facing the fourteenth plate 540 and a pair of stoppers 531 corresponding to the pair of rails 541. When the pair of rails 541 are disposed in the space 532 and are coupled with the pair of stoppers 531 as shown in FIG. 5B, the fourteenth plate 540 may not be easily separated in a z-axis direction (e.g., a direction perpendicular to the planar portion 322 of FIG. 3) from the thirteenth plate 530, and may be in a state of being slidable in the y-axis direction with respect to the thirteenth plate 530. According to an embodiment, the thirteenth plate 530 may be the inner structure 311 of FIG. 3, and the fourteenth plate 540 may be the second plate 330 of FIG. 3. According to some embodiments, the thirteenth plate 530 may be the second plate 330 of FIG. 3, and the fourteenth plate 540 may be the inner structure 311 of FIG. 3.

Referring to FIG. 5C, the second plate 530c (e.g., 330 of FIG. 3) may include both-side extensions 533c which protrude in an x-axis direction (e.g., the third direction 3003 of FIG. 3) with respect to the flexible display 520c (e.g., 320 of FIG. 3). A side member 510c (e.g., 310 of FIG. 3) may include both-side grooves 513c into which the both-side extensions 533c of the second plate 530c are inserted, and the both-side grooves 513c may be extended along the y-axis direction (e.g., the first direction 3001 or second direction 3002 of FIG. 3). Due to the coupling between the both-side extensions 533c and the both-side grooves 513c, the second plate 530c may not be easily separated in a z-axis direction (e.g., a direction perpendicular to the planar portion 322 of FIG. 3) with respect to the side member 510c, and may be in a structure of being slidable in the y-axis direction with respect to the side member 510c.

When a sliding structure 500a of FIG. 5A, a sliding structure 500b of FIG. 5B, or a sliding structure 500c of FIG. 5C is applied to the electronic device 300 of FIG. 3, the second plate 330 may be slidable on the inner structure 311 without being lifted from the inner structure 311. According to some embodiments, the sliding structure 500a of FIG. 5A, the sliding structure 500b of FIG. 5B, or the sliding structure 500c of FIG. 5C may be applied to an assembly structure of the shaft portion 362 and flexible plate 370 of FIG. 3.

Referring back to FIG. 4A or 4B, the electronic device 300 may also be in an intermediate state (or a third state) which is distinct from the closed state 300a in which the planar portion 322 of the flexible display 320 is no longer movable in the first direction 3001, and the open state 300b in which the planar portion 322 of the flexible display 320 is no longer movable in the second direction 3002. According to an embodiment, the electronic device 300 may include a position adjusting device for automatically switching from the intermediate state to the closed state 300a, or from the intermediate state to the open state 300b, when external force applied to the flexible display 320 is released. According to an embodiment, when the second plate 330, the third plate 380, or the flexible plate 370 is in a third position between a first position corresponding to the closed state 300a and a second position corresponding to the open state 300b in a state where external force applied to the flexible display 320 is released, the position adjusting device may automatically move the third plate 380 to the first position or the second position.

Figure 6A:
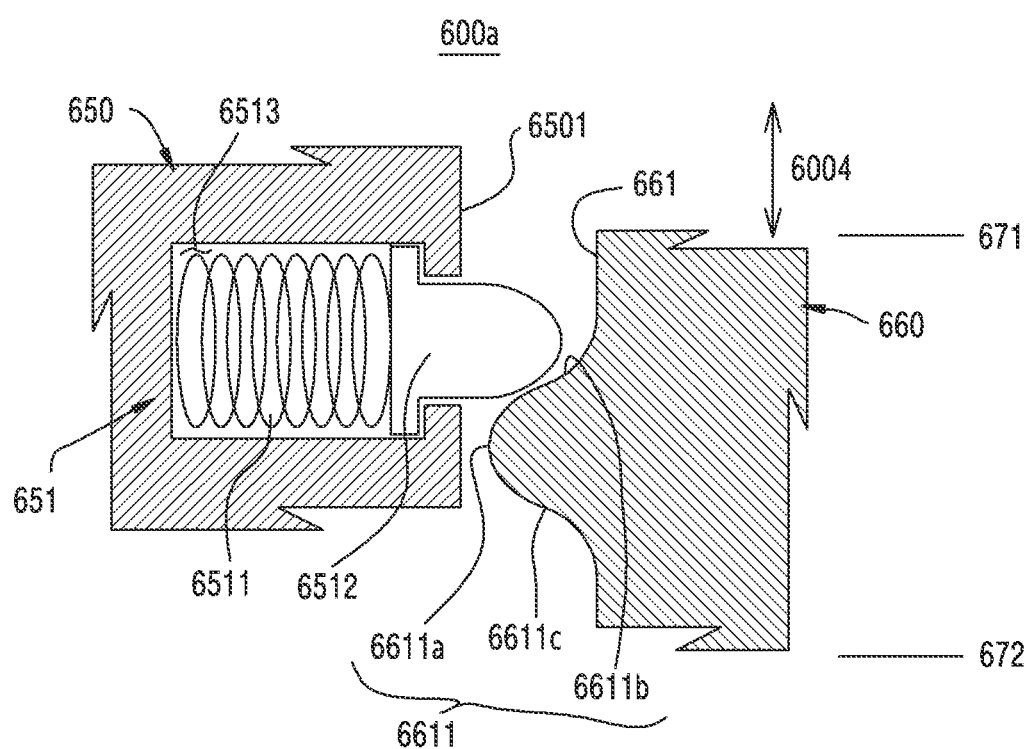
FIG. 6A is a cross-sectional view for a device for adjusting a position of a slidable member according to various embodiments of the disclosure.
Figure 6B:
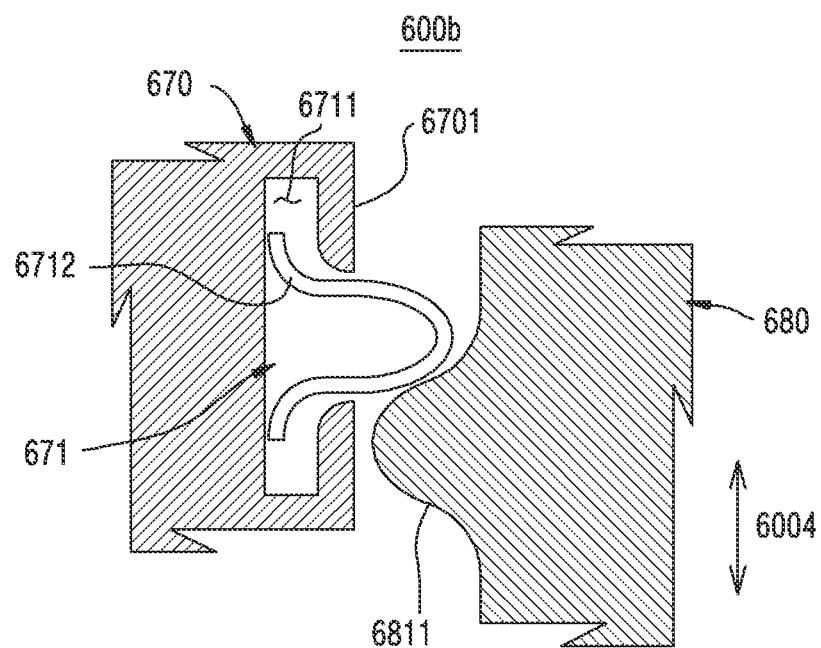
FIG. 6B is a cross-sectional view for a device for adjusting a position of a slidable member according to various embodiments of the disclosure.

FIG. 6A and FIG. 6B are cross-sectional views for a device for adjusting a position (hereinafter, a position adjusting device) of a slidable member according to various embodiments of the disclosure.

Referring to FIG. 6A, a positioning adjusting device 600a may include a first member 650 and a second member 660 which is movable with respect to the first member 650. The position adjusting device 600a may include a pressuring device 651 coupled to the first member 650, and the pressing device 651 may elastically press the second member 660 with respect to movement of the second member 660. According to an embodiment, the pressing device 651 may include a groove-shaped space 6513 constructed on a face 6501 facing the second member 660, an elastic member 6511 such as a coil spring disposed in the space 6513, and a movement member 6512 which is movable in an inner direction or outer direction of the space 6513 by being elastically supported by the elastic member 6511. The second member 660 may include a contact face 661 corresponding to the movement member 6512 of the first member 650, and may include a curved face 6611 which is convex towards the first member 650 as shown in FIG. 6A. When the second member 660 is moved in a fourth direction 6004 (e.g., the first direction 3001 or second direction 3002 of FIG. 3), the movement member 6512 may be moved by being elastically supported by the elastic member 6511 in a direction not entirely parallel to the fourth direction 6004 (e.g., an orthogonal direction) with respect to the contact face 661. According to an embodiment, when external force applied to the second member 660 is released in a state where the movement member 6512 is located at both regions 6611b and 6611c of a highest point 6611a of the curved face 6611, the second member 660 may be automatically moved to a first position 671 or a second position 672 by means of the pressing device 651.

In another embodiment, referring to FIG. 6B, a position adjusting device 600b may include a third member 670 and a fourth member 680 which is movable with respect to the third member 670. The position adjusting device 600b may include the pressing device 671 coupled to the third member 670, and the pressing device 671 may elastically press the fourth member 680 with respect to movement of the third member 670. The sliding structure 600b of FIG. 6B may be designed to have the pressing device 671 different from the sliding structure 600a of FIG. 6A, and thus may automatically move the fourth member 680 similarly to the sliding structure 600a of FIG. 6A. According to an embodiment, the pressing device 671 may include a groove-shaped space 6711 constructed on a face 6701 facing the fourth member 680, and a plate 6712 which is coupled to the space 6711 and is convex towards the fourth member 680. When the fourth member 680 is moved in the fourth direction 6004 (e.g., the first direction 3001 or second direction 3002 of FIG. 3), the plate 6712 may be spread in the fourth direction 6004 in response to a curved face 6811 of the fourth member 680 or may be restored to an original convex shape by self-elasticity.

According to various embodiments, various pressing devices may be utilized other than the pressing device 651 of FIG. 6A or the pressing device 671 of FIG. 6B.

According to various embodiments, the position adjusting device 600a of FIG. 6A or the position adjusting device 600b of FIG. 6B may be applied between the second plate 330 and the inner structure 311, between the inner structure 311 and the side member 310, or between the first plate 390 and the third plate 380 of FIG. 3, 4A, or 4B.

Figure 7A:
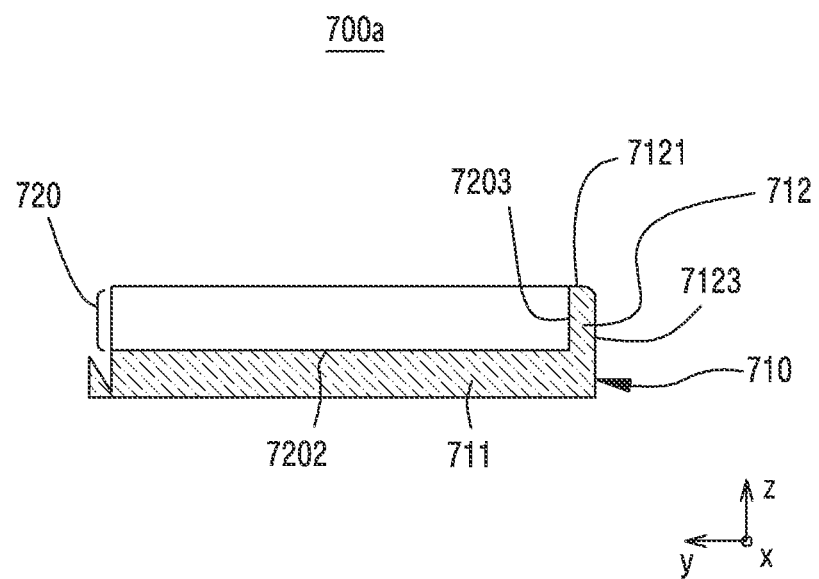
FIG. 7A is a cross-sectional view for a coupling structure of a movable flexible display and a display support member according to various embodiments of the disclosure.
Figure 7B:
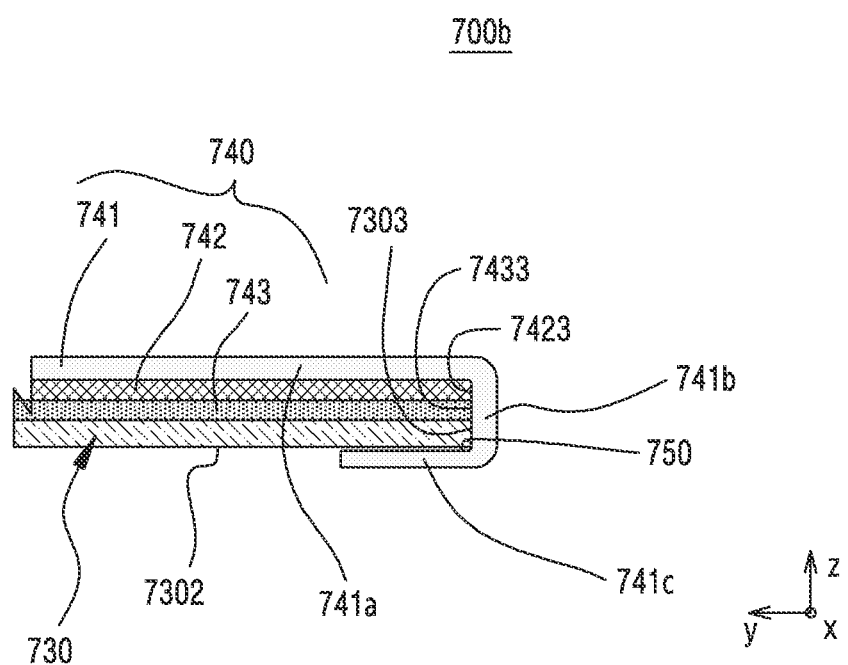
FIG. 7B is a cross-sectional view for a coupling structure of a movable flexible display and a display support member according to various embodiments of the disclosure.
Figure 7C:
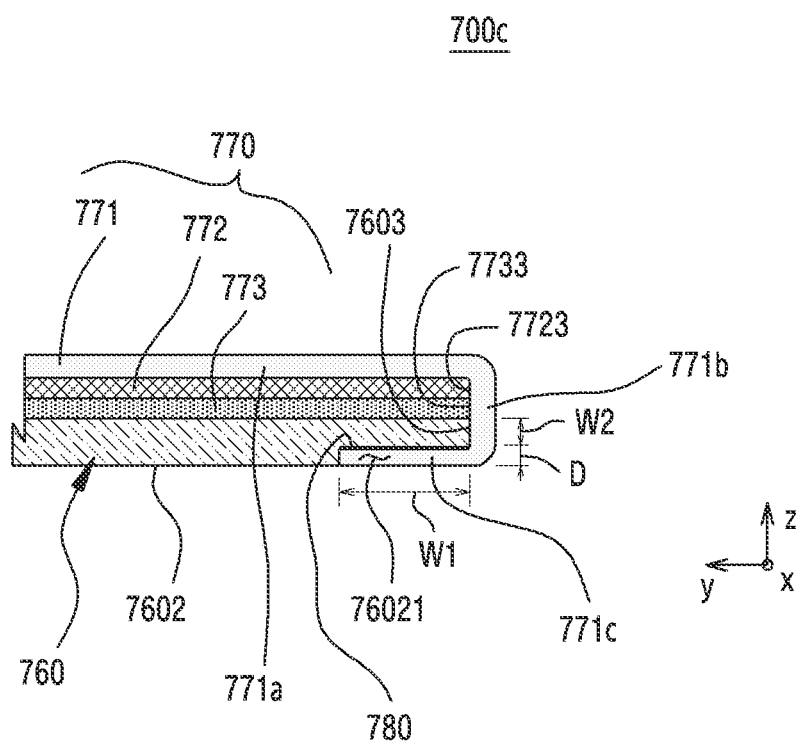
FIG. 7C is a cross-sectional view for a coupling structure of a movable flexible display and a display support member according to various embodiments of the disclosure.

FIGS. 7A, 7B, and 7C are cross-sectional views for a coupling structure of a movable flexible display and a display support member according to various embodiments of the disclosure.

Referring to FIG. 7A, in a coupling structure 700a according to an embodiment, a display support member 710 may include a plate-shaped bottom portion 711 which covers a rear face 7202 of a flexible display 720 (e.g., 320 of FIG. 4A and FIG. 4B) and a sidewall portion 712 extended from the bottom portion 711 to cover a side face 7203 of the flexible display 720. Referring back to FIGS. 4A and 4B, the second plate 330 may be replaced with the display support member 710 of FIG. 7A. In this case, the sidewall portion 712 may be in contact with one face 402 of the first sidewall 3101 in the closed state 300a, and may be separated from the face 402 of the first sidewall 3101 in the open state 300b. In the open state 300b, the space 441 aligned to the portion 3111a of the third face 3111 may be defined as a space between a side face 7123 of the sidewall portion 712 and the face 402 of the first sidewall 3101. According to an embodiment, an upper face 7121 of the sidewall portion 712 may construct one portion of a front face (e.g., 110A of FIG. 1A) of the electronic device. According to some embodiments, the face 402 of the first sidewall 3101 may be designed to include a groove capable of engaging the sidewall portion 712. In this case, the sidewall portion 712 may not be exposed in the closed state 300a.

Referring to FIG. 7B, in a coupling structure 700b according to another embodiment, a light-transmitting plate 741 of a flexible display 740 may include a first portion 741a laminated with a panel 742 (e.g., 320b of FIG. 4A) and a substrate 743 (e.g., 320c of FIG. 4A) and a second portion 741b extended from the first portion 741a and disposed to cover a side face 7423 of the panel 742, a side face 7433 of the substrate 743, and a side face 7303 of a display support member 730 (e.g., the second plate 330 of FIG. 4A). In addition, the light-transmitting plate 741 may include a third portion 741c extended from the second portion 741b and disposed to cover part of a rear face 7302 of the display support member 730. According to an embodiment, a junction layer 750 including an organic material or the like may be interposed between the third portion 741c and the rear face 7302 of the display support member 730 and thus, the second portion 741b and third portion 741c of the light-transmitting plate 741 may maintain the shape shown in FIG. 7B without being lifted. Referring again to FIGS. 4A and 4B, the light-transmitting plate 320a of the flexible display 320 may be replaced with the light-transmitting plate 741 of FIG. 7B. In this case, the second portion 741b of the light transmitting plate 741 may be in contact with one face 402 of the first sidewall 3101 in the closed state 300a, and may be separated from the face 402 of the first sidewall 3101 in the open state 300b. In the open state 300b, the space 441 aligned to the portion 3111a of the third face 3111 may be defined as a space between the second portion 741b of the light-transmitting plate 741 and the face 402 of the first sidewall 3101.

Referring to FIG. 7C, in a coupling structure 700c according to another embodiment, a light-transmitting plate 771 of the flexible display 770 may include a first portion 771a, a second portion 771b, and a third portion 771c. The first portion 771a may be laminated with a panel 772 (e.g., 320b of FIG. 4A) and a substrate 773 (e.g., 320c of FIG. 4A). The second portion 771b may be extended from the first portion 771a, and may be disposed to cover a sidewall 7723 of the panel 772, a side face 7733 of the substrate 773, and a side face 7603 of a display support member 760 (e.g., the second plate 330 of FIG. 4A). According to an embodiment, the third portion 771c may be extended from the second portion 771b, and may be disposed in a groove 76021 constructed on a rear face 7602 of the display support member 760. A junction layer 780 including an organic material or the like may be interposed between the third portion 771c and the display support member 760, and thus the second portion 771b and third portion 771c of the light-transmitting plate 771 may maintain the shape shown in FIG. 7C without being lifted. According to an embodiment, the groove 76021 has a shape in which a boundary region of the rear face 7602 of the display support member 760 is removed by a width W1 and a depth D, and may be rectangular in a cross-sectional view. The width W1 and depth D of the groove 76021 may be designed to be disposed such that the third portion 771c does not protrude with respect to the display support member 760. According to an embodiment, the depth D of the groove 76021 may be designed to be not less than a thickness of the third portion 771c. When the depth D of the groove 76021 is designed to be greater than the thickness of the third portion 771c, a width W2 of the side face 7603 of the display support member 760 may be relatively decreased. In this case, a size of the second portion 771b which covers the side face 7603 is decreased, and the third portion 771c is increased in response to the decrease. Therefore, the width W1 of the groove 76021 may be further extended, or the third portion 771c may be cut so as not to be greater than the width W1 of the groove 76021.

According to some embodiments, it is also possible to design a structure in which a substrate of a flexible display is extended to cover a side face of a light-transmitting plate and a side face of a panel.

The coupling structure 700a of FIG. 7A, the coupling structure 700b of FIG. 7B, or the coupling structure 700c of FIG. 7C may also prevent breakage of the flexible display. For example, the coupling structure 700a, 700b, or 700c may prevent the flexible plate, panel, and substrate of the flexible display from being separated from each other by external force in a second state (e.g., 300b of FIG. 4B).

According to various embodiments, the coupling structure 700a of FIG. 7A, the coupling structure 700b of FIG. 7B, or the coupling structure 700c of FIG. 7C may also prevent oxygen or moisture from penetrating into the organic material layer, anode, or cathode of the panel (e.g., 320b of FIG. 3).

Figure 8A:
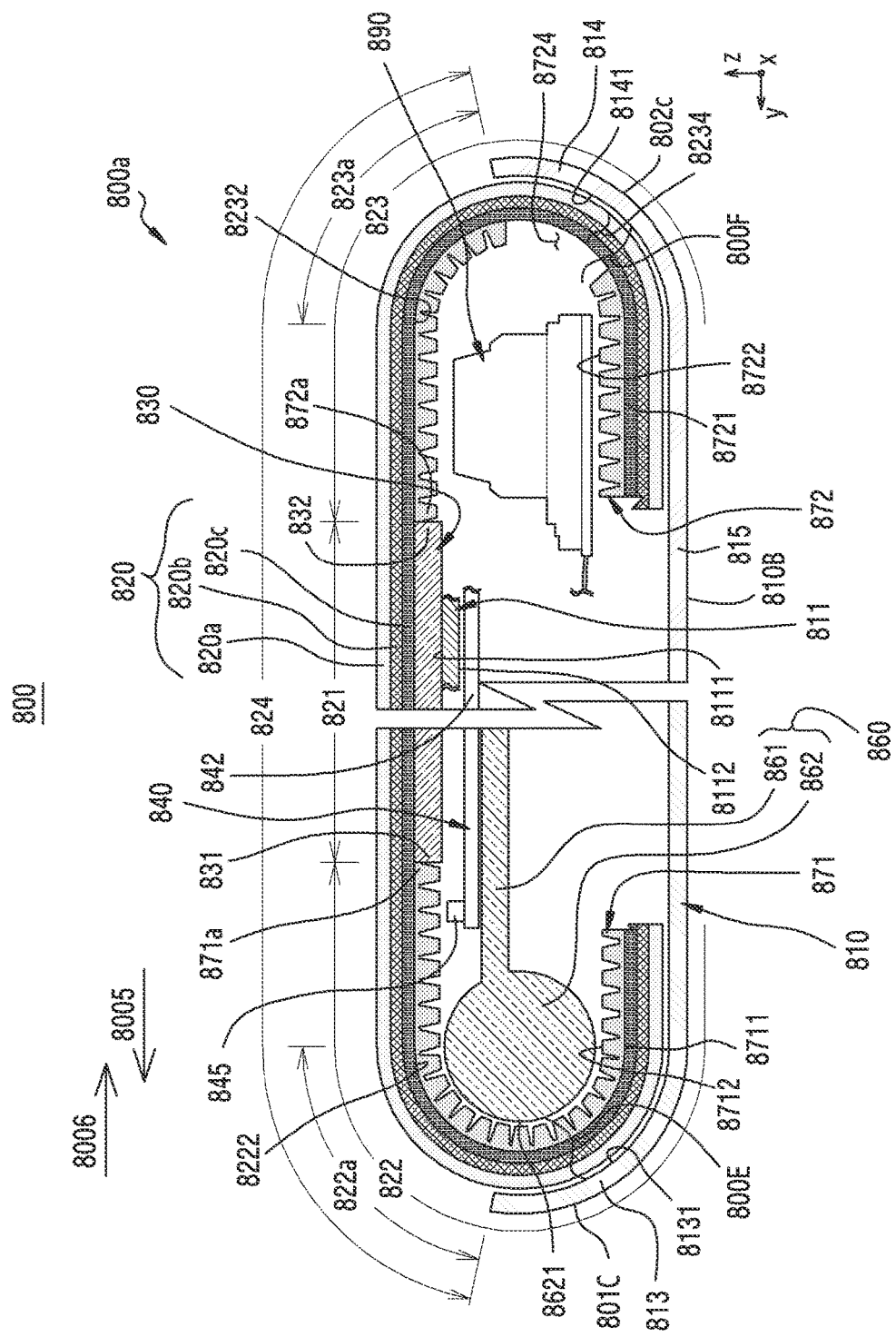
FIG. 8A is a cross-sectional view of an electronic device including a movable flexible display according to various embodiments of the disclosure.
Figure 8B:
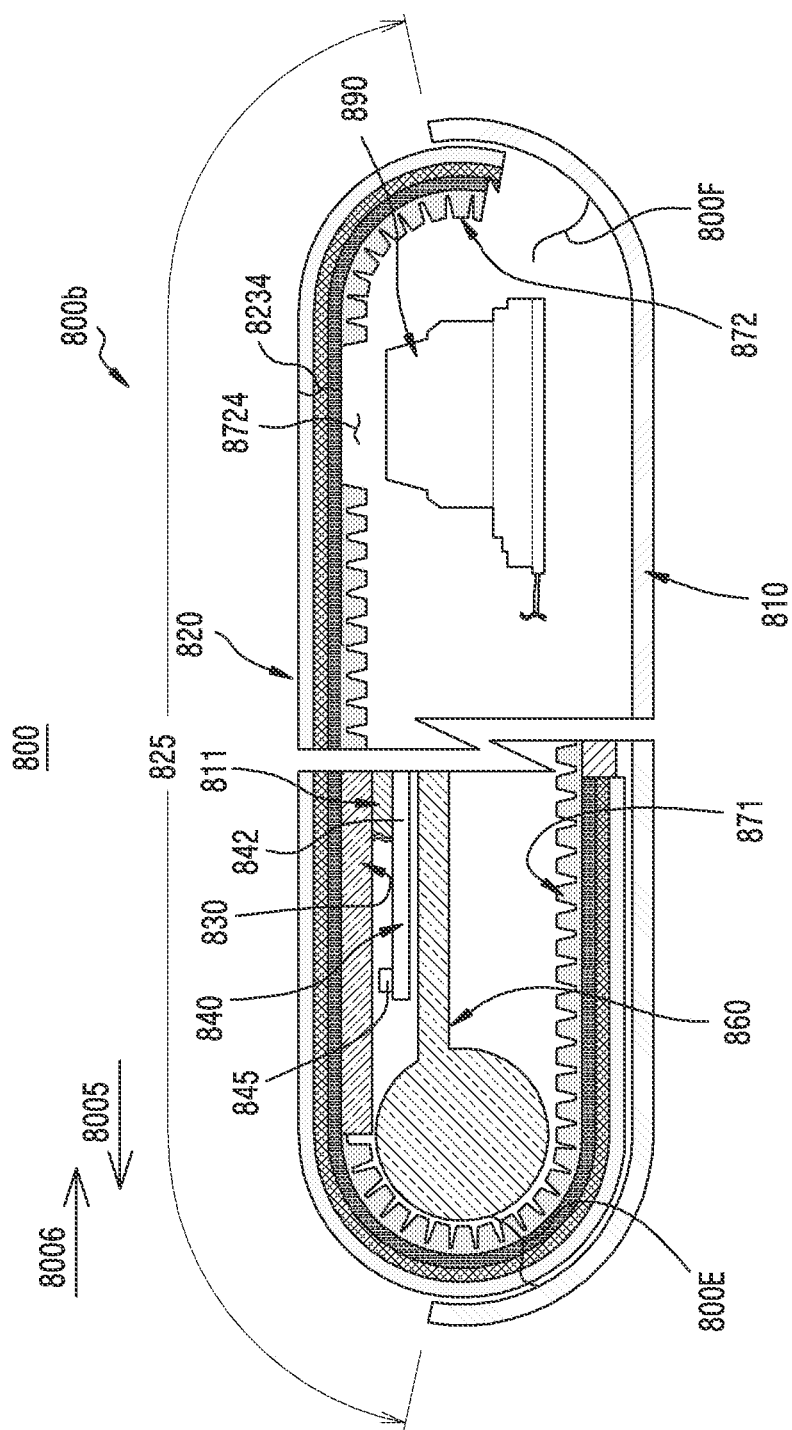
FIG. 8B is a cross-sectional view of an electronic device including a movable flexible display according to various embodiments of the disclosure.

FIGS. 8A and 8B are cross-sectional views of an electronic device including a movable flexible display according to various embodiments of the disclosure.

Referring to FIGS. 8A and 8B, an electronic device 800 may include a housing 810, a flexible display 820, an inner structure 811, a second plate 830, a printed circuit board 840, a support structure 860, a first flexible plate 871, a second flexible plate 872, and an optical module 890. At least one of the components of the electronic device 800 may be identical or similar to components of the electronic device 300 of FIG. 3, FIG. 4A, or FIG. 4B, and thus redundant descriptions will be omitted.

The housing 810 may construct a rear face 810B and some portions 801C and 802C of the side face of the electronic device 800. According to an embodiment, the housing 810 may include a first plate 815 constituting the rear face 810B and a third side member 813 and a fourth side member 814 extended to both sides from the first plate 815 to constitute the some portions 801C and 802C of the side face. According to an embodiment, the third side member 813 or the fourth side member 814 may be a curved plate including an inner curved face 8131 or 8141. According to various embodiments, the third side member 813 and the fourth side member 814 may be designed as an exterior member having various other shapes including the inner curved faces 8131 and 8141. The rear plate 815 may be integrated with the third side member 813 or the fourth side member 814, or according to some embodiments, may be separable from the third side member 813 or the fourth side member 814.

The inner structure 811 may be coupled with the third side member 813 or the fourth side member 814 by being disposed inside the electronic device 800, or may be integrated with the third side member 813 or the fourth side member 814. The inner structure 811 may be constructed of, for example, a metal material and/or a non-metal (e.g., polymer) material. The second plate 830 may be slidably coupled to one face 8111 of the inner structure 811, and the printed circuit board 840 may be coupled to another face 8112 of the inner structure 811.

The flexible display 820 may have a structure in which a light-transmitting plate 820a, a panel 820b, and a substrate 820c are laminated. According to an embodiment, the flexible display 820 may be coupled to the second plate 830. The second plate 830 may be disposed between the flexible display 820 and the inner structure 811, and may be slidably coupled to the inner structure 811. The flexible display 820 may include a planar portion 821 and a first bendable portion 822 and second bendable portion 823 extended into the electronic device 800 from the planar portion 821. According to an embodiment, the first bendable portion 822 may be disposed in a 'U' shape which is convex in a fifth direction 8005 in response to the inner curved face 8131 of the third side member 813. The first bendable portion 823 may be disposed in a 'U' shape which is convex in a sixth direction 8006 opposite to the fifth direction 8005 in response to the inner curved face 8141 of the fourth side member 814. The second plate 830 may be designed to have such a size that it is disposed along the planar portion 821 as a rigid plate, and the planar portion 821 may be maintained to be flat by the second plate 830. When the planar portion 821 of the flexible display 820 coupled with the second plate 830 is moved (e.g., translational motion) in the fifth direction 8005 by external force, the electronic device 800 may be in a state (e.g., the second state 800b of FIG. 8B) where one portion 822a of the first bendable portion 822 coupled to the planar portion 821 is led into the electronic device 800 and one portion 823a of the second bendable portion 823 coupled to the planar portion 821 is led out from the electronic device 800. When the planar portion 821 of the flexible display 820 coupled with the second plate 830 is moved in the sixth direction 8006 by external force, the electronic device 800 may be in a state (e.g., the fourth state 800a of FIG. 8A) where the one portion 822a of the first bendable portion 822 coupled to the planar portion 821 is led out from the electronic device 800 and the one portion 823a of the second bendable portion 823 coupled to the planar portion 821 is led into the electronic device 800.

The support structure 860 (e.g., 360 of FIG. 3) may be disposed inside the electronic device 800, and may include a plate portion 861 and a shaft portion 862 coupled with the plate portion 861. One portion 842 of the printed circuit board 840 may be disposed between the inner structure 811 and the plate portion 861 of the support structure 860. The shaft portion 862 has generally a shape including a curved face 8621, and for example, may have a shape similar to a cylinder. A first curved space 800E which is convex in the fifth direction 8005 may be present between the inner curved face 8131 of the third side member 813 and the curved face 8621 of the shaft portion 862, and the first bendable portion 822 of the flexible display 820 may be moved by being guided to the first curved space 800E. The first bendable portion 823 of the flexible display 820 may be moved by being guided to the inner curved face 8141 of the fourth side member 814. According to some embodiments, when a member such as the shaft portion 862 of the third support member 860 is designed to be disposed in association with the fourth side member 814, a second curved space 800F may be provided to guide the movement of the second bendable portion 823 of the flexible display 820.

According to an embodiment, the first flexible plate 871 (e.g., 370 of FIG. 4A or 4B) may be disposed along a rear face 8222 of the first bendable portion 822, and may maintain a 'U' shape which is convex in the fifth direction 8005. The second flexible plate 872 may be disposed along a rear face 8232 of the second bendable portion 823, and may maintain a 'U' shape which is convex in the sixth direction 8006. The first and second flexible plates 871 and 872 may be movable along the curved spaces 800E and 800F while the first and second bendable portions 822 and 823 maintain a smooth shape without being modified to be embossed by force delivered when the planar portion 821 coupled with the rigid second plate 830 is moved in the fifth direction 8005 or the sixth direction 8006.

According to an embodiment, faces 8711 and 8721 of the first and second flexible plates 871 and 872 coupled with the flexible display 820 may be substantially flat, and the other faces 8712 and 8722 of the first and second flexible plates 871 and 872 have a structure in which concavity and convexity are regularly arranged. The other faces 8712 and 8722 of the concave-convex structure may allow the first and second flexible plates 871 and 872 to be easily bent in a curved shape.

According to an embodiment, it may be designed such that there is substantially no gap between ends 831 and 871a of the second plate 830 coupled to the flexible display 820 and the first flexible plate 871, or these ends 831 and 871a may be coupled by using an adhesive or the like. It may be designed such that there is substantially no gap between the ends 832 and 872a of the second plate 830 coupled with the flexible display 820 and the second flexible plate 872, or these end portions 832 and 872a may be coupled by using an adhesive or the like. Accordingly, when the second plate 830 is moved in the fifth direction 8005 or the sixth direction 8006, force based thereon may be delivered directly to the first and second flexible plates 871 and 872.

According to various embodiments, although not shown, the electronic device 800 may further include a third plate (e.g., 380 of FIG. 3) slidably coupled to the first plate 815 in response to the movement of the flexible display 820. The third plate may be coupled to the first bendable portion 822 of the flexible display 820 and/or the first flexible plate 871, or according to some embodiments, may also be coupled to the second bendable portion 823 of the flexible display 820 and/or the second flexible plate 872. When switching between a fourth state 800a and a fifth state 800b, the third plate may facilitate the flexible display 820 and the flexible plates 871 and 872 to maintain a convex 'U' shape.

According to an embodiment, the second flexible plate 872 may include an opening 8724, and when switched from the fourth state 800a to the fifth state 800b, the opening 8724 may be aligned to the optical module 890 such as a proximity sensor. In the fifth state 800b, external light may be introduced to the optical module 890 through a portion 8234 (hereinafter, a fourth region) aligned to the opening 8724 of the second bendable portion 823. In the fifth state 800b, light output from the optical module 890 may be emitted to the outside through the fourth region 8234. In the fifth state 800b, the fourth region 8234 may be set to be disabled or inactive.

According to an embodiment, the electronic device 800 may include at least one sensor for acquiring information (e.g., sliding or a distance) regarding switching between the fourth state 800a and the fifth state 800b, movement of the flexible display 820, movement of the second plate 830, movement of the first flexible plate 871, movement of the second flexible plate 872, or movement of the third plate (e.g., 380 of FIG. 4A or 4B). According to an embodiment, a sensor 845 may be mounted on the printed circuit board 840 or may be placed at a position separated from the printed circuit board 840, and may be electrically coupled with the printed circuit board 840 by using an FPCB or the like.

A control circuit (e.g., a processor) of the electronic device 800 may perform various operations on the basis of information acquired from the sensor 845. According to an embodiment, upon detecting the fourth state 800a by using the sensor 845, the processor may selectively activate at least part of a region 824 exposed to the outside in the flexible display 820 when there is a need to display an image. According to an embodiment, upon detecting the fifth state 800b by using the sensor 845, the processor may selectively activate at least part of a region 825 exposed to the outside in the flexible display 820 when there is a need to display an image.

Figure 9A:
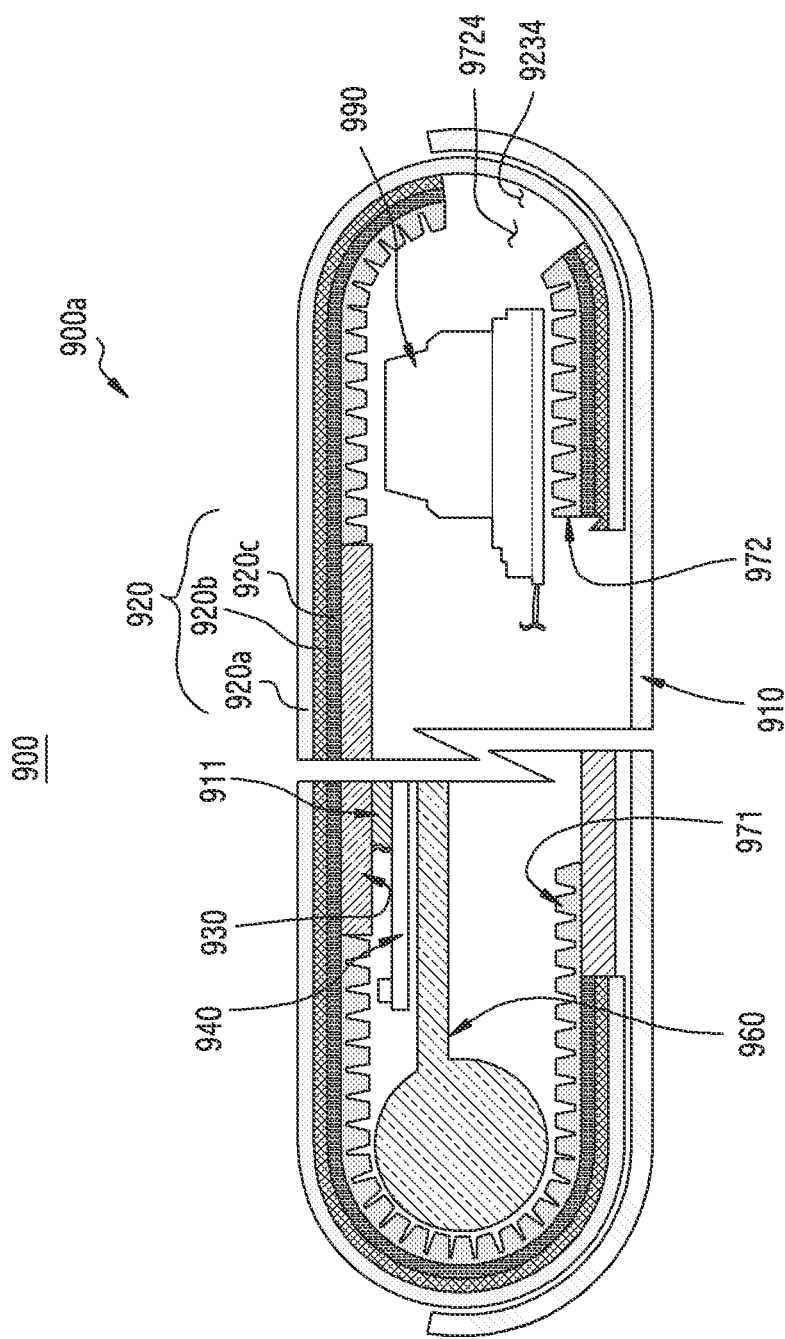
FIG. 9A is a cross-sectional view of an electronic device including a movable flexible display according to various embodiments of the disclosure.
Figure 9B:
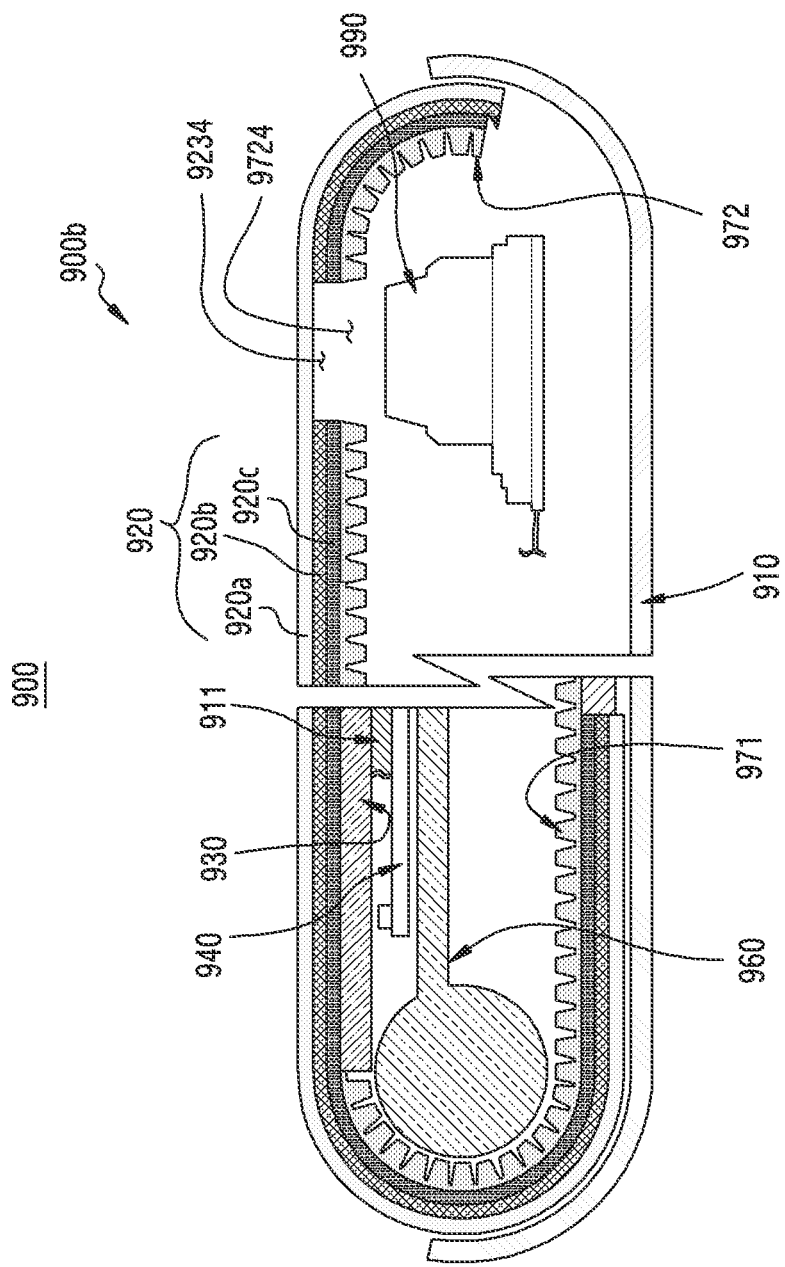
FIG. 9B is a cross-sectional view of an electronic device including a movable flexible display according to various embodiments of the disclosure.

FIGS. 9A and 9B are cross-sectional views of an electronic device including a movable flexible display according to various embodiments of the disclosure.

Referring to FIGS. 9A and 9B, an electronic device 900 may include a housing 910, a flexible display 920, an inner structure 911, a second plate 930, a printed circuit board 940, a support structure 960, a first flexible plate 971, a second flexible plate 972, and an optical module 990. At least one of the components of the electronic device 900 may be identical or similar to components of the electronic device 800 of FIG. 8A or FIG. 8B, and thus redundant descriptions will be omitted. For example, the housing 910, the inner structure 911, the second plate 930, the printed circuit board 940, the support structure 960, the first flexible plate 971, the second flexible plate 972, and the optical module 990 may be respectively identical or similar to the housing 810, the inner structure 811, the second plate 830, the printed circuit board 840, the support structure 860, the first flexible plate 871, the second flexible plate 872, and the optical module 890 of FIG. 8A or 8B.

The flexible display 920 may include a light-transmitting plate 920a, a panel 920b, and a substrate 920c. According to an embodiment, the flexible display 920 may include a concave portion 9234 aligned to an opening 9724 constructed on the second flexible plate 972, and the concave portion 9234 may have a shape in which part of the panel 920b and part of the substrate 920c are removed. When switched from a first state 900a to a second state 900b, the opening 9724 of the second flexible plate 972 and the concave portion 9234 of the flexible display 920 may be aligned to the optical module 990 such as a proximity sensor. In the second state 900b, external light may be introduced to the optical module 990 through the light-transmitting plate 920a and concave portion 9234 of the flexible display 920 and the opening 9724 of the second flexible plate 972. In the second state 900b, light output from the optical module 990 may be emitted to the outside through the opening 9724 of the second flexible plate 972 and the concave portion 9234 and light-transmitting plate 920a of the flexible display 920.

Figure 10:
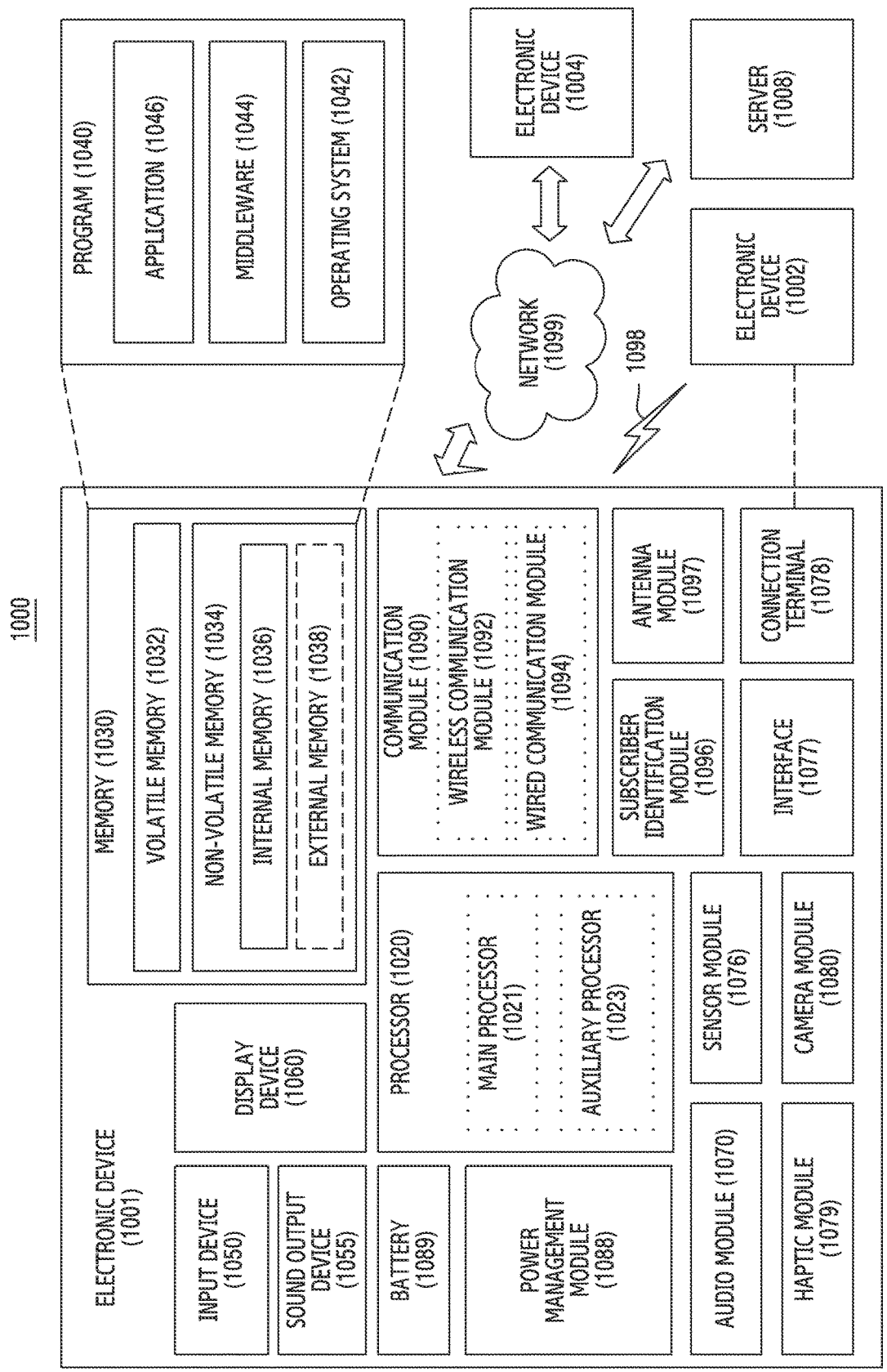
FIG. 10 is a block diagram illustrating an electronic device in a network environment according to various embodiments of the disclosure.

FIG. 10 is a block diagram illustrating an electronic device in a network environment according to various embodiments of the disclosure.

Referring to FIG. 10, an electronic device 1001 in a network environment 1000 may communicate with an electronic device 1002 via a first network 1098 (e.g., a short-range wireless communication network), or may communicate with an electronic device 1004 or a server 1008 via a second network 1099 (e.g., a long-range wireless communication network). According to an embodiment, the electronic device 1001 may also communicate with the electronic device 1004 via the server 1008. According to an embodiment, the electronic device 1001 may include a processor 1020, memory 1030, an input device 1050, a sound output device 1055, a display device 1060, an audio module 1070, a sensor module 1076, an interface 1077, a haptic module 1079, a camera module 1080, a power management module 1088, a battery 1089, a communication module 1090, a subscriber identification module (SIM) 1096, and/or an antenna module 1097. In some embodiments, at least one (e.g., the display device 1060 or the camera module 1080) of the components may be omitted from the electronic device 1001, or one or more other components may be added in the electronic device 1001. In some embodiments, some of the components may be implemented as single integrated circuitry. For example, the sensor module 1076 (e.g., a fingerprint sensor, an iris sensor, or an illuminance sensor) may be implemented as embedded in the display device 1060 (e.g., a display).

The processor 1020 may execute, for example, software (e.g., a program 1040) to control at least one other component (e.g., a hardware or software component) of the electronic device 1001 coupled or in communication with the processor 1020, and may perform various data processing or data computations. According to an embodiment, as at least part of the data processing or computation, the processor 1020 may load a command or data received from another component (e.g., the sensor module 1076 or the communication module 1090) in volatile memory 1032, process the command or the data stored in the volatile memory 1032, and store resulting data in non-volatile memory 1034. According to an embodiment, the processor 1020 may include a main processor 1021 (e.g., a central processing unit (CPU) or an application processor (AP)), and an auxiliary processor 1023 (e.g., a graphics processing unit (GPU), an ISP, a sensor hub processor, or a CP) that is operable independently from, or in conjunction with, the main processor 1021. Additionally or alternatively, the auxiliary processor 1023 may be adapted to consume less power than the main processor 1021, or to be specific to a specified function. The auxiliary processor 1023 may be implemented as separate from, or as part of the main processor 1021.

The auxiliary processor 1023 may control at least some of the functions or states related to at least one component (e.g., the display device 1060, the sensor module 1076, or the communication module 1090) among the components of the electronic device 1001, instead of the main processor 1021, while the main processor 1021 is in an inactive (e.g., sleep) state, or together with the main processor 1021 while the main processor 1021 is in an active state (e.g., executing an application). According to an embodiment, the auxiliary processor 1023 (e.g., an ISP or a CP) may be implemented as part of another component (e.g., the camera module 1080 or the communication module 1090) functionally related to the auxiliary processor 1023.

The memory 1030 may store various data used by at least one component (e.g., the processor 1020 or the sensor module 1076) of the electronic device 1001. The various data may include, for example, software (e.g., the program 1040) and input data or output data for a command related thereto. The memory 1030 may include the volatile memory 1032 and/or the non-volatile memory 1034. The non-volatile memory 1034 may further include an internal memory 1036 and/or an external memory 1038.

The program 1040 may be stored in the memory 1030 as software, and may include, for example, an operating system (OS) 1042, middleware 1044, and/or an application 1046.

The input device 1050 may receive a command or data to be used by other components (e.g., the processor 1020) of the electronic device 1001, from outside (e.g., a user) of the electronic device 1001. The input device 1050 may include, for example, a microphone, a mouse, or a keyboard, but embodiments are not limited thereto.

The sound output device 1055 may output sound signals to outside of the electronic device 1001. The sound output device 1055 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 1060 may visually provide information to outside (e.g., a user) of the electronic device 1001. The display device 1060 may include, for example, a display, a hologram device, and/or a projector and control circuitry to control a corresponding one of the display, hologram device, and projector. According to an embodiment, the display device 1060 may include touch circuitry adapted to detect a touch, or sensor circuitry (e.g., a pressure sensor) adapted to measure the intensity of force incurred by the touch.

According to an embodiment, the display device 1060 may include a flexible display (e.g., 320 of FIG. 4A or 4B) which is slidable in the electronic device 1001 so that a screen can be reduced or extended. According to an embodiment, one side region of the flexible display may be led into or led out from a housing through an access opening (e.g., 110E of FIG. 1A or 1B) constructed in the housing (e.g., 110 of FIG. 1A or 1B) constructing an exterior of the electronic device 1001. The electronic device 1001 may be in a closed state in which one side region (e.g., 121 of FIG. 1A or 321 of FIG. 4A) of the flexible display is led out from the housing 110 and an open state in which one side region of the flexible display is led into the housing. When switched from the open state to the closed state, since one side region of the flexible display is led out from the housing, the screen can be extended. When switched from the closed state to the open state, since one side region of the flexible display is led into the housing, the screen can be reduced. According to an embodiment, one side region of the flexible display may be moved into the housing by being guided to a curved space (e.g., 300E of FIG. 4A or 4B) provided to the electronic device 1001. In the open state, one side region (e.g., 121 of FIG. 1A or 321 of FIG. 4A) of the flexible display may be set to be disabled or inactive. In the closed state, optionally, one side region of bendable portion 121 or bendable portion 321 of the flexible display may be selectively activated.

According to an embodiment, in the closed state, the other region of the flexible display may cover a region (e.g., third face 110D of FIG. 1B or portion 3111a of FIG. 4B) (hereinafter, a component interface portion) in which an electronic component is installed or utilized. In the open state, the component interface portion 110D or 3111a may be exposed to the outside.

The audio module 1070 may convert a sound into an electrical signal and convert an electrical signal into sound. According to an embodiment, the audio module 1070 may obtain the sound via the input device 1050, or output the sound via the sound output device 1055 or an external electronic device (e.g., the electronic device 1002) (e.g., a speaker or a headphone) directly or wirelessly coupled with the electronic device 1001.

According to an embodiment, at least part of the sound output device 1055 may utilize a component interface portion (e.g., 110D of FIG. 1B or 3111a of FIG. 4B). For example, the component interface portion (e.g., 110D or 3111a) may be designed to include a receiver hole (e.g., of module 114 of FIG. 1B) aligned to a receiver.

According to various embodiments, when the electronic device 1001 is switched from the closed state to the open state, the audio module 1070 may be configured to output a sound corresponding thereto.

The sensor module 1076 may detect an operational state (e.g., power or temperature) of the electronic device 1001 or an environmental state (e.g., a state of a user) external to the electronic device 1001, and then generate an electrical signal or data value corresponding to the detected state. According to an embodiment, the sensor module 1076 may include, for example, a gesture sensor, a gyro sensor, an atmospheric pressure sensor, a magnetic sensor, an acceleration sensor, a grip sensor, a proximity sensor, a pressure sensor, a color sensor, an infrared (IR) sensor, a biometric sensor, a temperature sensor, a humidity sensor, and/or an illuminance sensor. According to an embodiment, at least part (e.g., the sensor 345 of FIG. 4A or 4B) of the sensor module 1076 may acquire information on the closed state (e.g., 300a of FIG. 4A) or the open state (e.g., 300b of FIG. 4B), and the acquired information may be provided to the processor 1020. According to various embodiments, at least part of the sensor module 1076 may acquire information on a distance by which the flexible display is moved.

According to an embodiment, at least part of the sensor module 1076 may utilize a component interface portion (e.g., 110D of FIG. 1B or 3111a of FIG. 4B). For example, an optical sensor such as a gesture sensor, a grip sensor, a proximity sensor, a color sensor, an InfraRed (IR) sensor, a biometric sensor, an illuminance sensor, or the like, may be aligned to the component interface portion (e.g., 110D or 3111a). The component interface portion (e.g., 110D or 3111a) may include an opening or a light transmitting region. In the second state, light output from the optical sensor may be emitted to the outside through the component interface portion (e.g., 110D or 3111a), or external light may be introduced to the optical sensor through the component interface portion (e.g., 110D or 3111a). According to some embodiments, the component interface portion (e.g., 110D or 3111a) may be designed to include an optical sensor, an optical filter, an optical lens, or the like.

The interface 1077 may support one or more specified protocols to be used for the electronic device 1001 to be coupled with the external electronic device (e.g., the electronic device 1002) directly or wirelessly. According to an embodiment, the interface 1077 may include, for example, a HDMI, a USB interface, an SD card interface, or an audio interface.

A connecting terminal 1078 may include a connector via which the electronic device 1001 may be physically connected with an external electronic device (e.g., the electronic device 1002). According to an embodiment, the connecting terminal 1078 may include, for example, an HDMI connector, a USB connector, an SD card connector, or an audio connector (e.g., a headphone connector).

The haptic module 1079 may convert an electrical signal into a mechanical stimulus (e.g., a vibration or a movement) or electrical stimulus which may be recognized by a user via tactile sensation or kinesthetic sensation. According to an embodiment, the haptic module 1079 may include, for example, a motor, a piezoelectric element, or an electric stimulator.

The camera module 1080 may capture still images or moving images. According to an embodiment, the camera module 1080 may include one or more lenses, image sensors, ISPs, and/or flashes. According to an embodiment, the camera module 1080 may utilize a component interface portion (e.g., 3111a of FIG. 4B). The component interface portion (e.g., 3111a) may include an opening or a light transmitting region. In the open state, external light may be introduced to the camera module 1080 (e.g., the first camera module 105 of FIG. 1B) through the component interface portion (e.g., 3111a), or light output from a flash of the camera module 1080 may be emitted to the outside through the component interface portion (e.g., 3111a). According to some embodiments, the component interface portion (e.g., 3111a) may be designed to include at least some of lenses of the camera module 1080.

The processor 1020 may perform configured various operations, on the basis of information regarding the closed state or open state of the electronic device 1001 and acquired from the sensor module 1076. According to an embodiment, if a trigger condition defined as switching between the closed state and the open state is satisfied, the processor 1020 may perform a corresponding action on the basis of a mode of the electronic device 1001. The memory 1030 may store a first trigger condition when the electronic device 1001 is switched from the closed state to the open state and a first trigger including an action to be performed in a current mode in response to the first trigger condition. The memory 1030 may store a second trigger condition when the electronic device 1001 is switched from the open state to the closed state and a second trigger including an action to be performed in the current mode in response to the second trigger condition. The mode of the electronic device 1001 may include a standby mode, a sleep mode (or a low power mode), a lock mode, a program execution state (e.g., an application execution mode) executed based on a user input or an event, or the like. According to various embodiments, the electronic device 1001 may be designed to generate various triggers for the first trigger condition or second trigger condition on the basis of the user input.

According to an embodiment, the processor 1020 may determine a screen region which is exposed to the outside in the closed state or open state of the electronic device 1001, and may selectively activate at least part of the determined region when there is a need to display an image. According to an embodiment, in the open state of the electronic device 1001, the processor 1020 may set a region led into the housing of the flexible display to a disabled or inactive state.

The power management module 1088 may manage power supplied to or used by the electronic device 1001. According to an embodiment, the power management module 1088 may be implemented as at least part of, for example, a power management integrated circuit (PMIC).

The battery 1089 may supply power to at least one component of the electronic device 1001. According to an embodiment, the battery 1089 may include, for example, a primary cell which is not rechargeable, a secondary cell which is rechargeable, a fuel cell, or combinations thereof.

The communication module 1090 may support establishing a direct (e.g., wired) communication channel or a wireless communication channel between the electronic device 1001 and the external electronic device (e.g., the electronic device 1002, the electronic device 1004, and/or the server 1008) and performing communication via the established communication channel. The communication module 1090 may include one or more CPs that are operable independently from the processor 1020 (e.g., the application processor (AP)) and supports a direct (e.g., wired) communication or a wireless communication. According to an embodiment, the communication module 1090 may include a wireless communication module 1092 (e.g., a cellular communication module, a short-range wireless communication module, or a global navigation satellite system (GNSS) communication module) and/or a wired communication module 1094 (e.g., a local area network (LAN) communication module or a power line communication (PLC) module). A corresponding one of these communication modules may communicate with an external electronic device via the first network 1098 (e.g., a short-range communication network, such as Bluetooth™ wireless-fidelity (Wi-Fi) direct, or infrared data association (IrDA)) and/or the second network 1099 (e.g., a long-range communication network, such as a cellular network, the Internet, or a computer network (e.g., LAN or wide area network (WAN)). These various types of communication modules may be implemented as a single component (e.g., a single chip), or may be implemented as multiple components (e.g., multi-chips) separate from each other. The wireless communication module 1092 may identify and authenticate the electronic device 1001 in a communication network, such as the first network 1098 or the second network 1099, using subscriber information (e.g., international mobile subscriber identity (IMSI)) stored in the subscriber identification module 1096.

The antenna module 1097 may transmit or receive a signal and/or power to or from the outside (e.g., the external electronic device) of the electronic device 1001. According to an embodiment, the antenna module 1097 may include one or more antennas and therefrom, at least one antenna appropriate for a communication scheme used in the communication network, such as the first network 1098 or the second network 1099, may be selected, for example, by the communication module 1090. The signal or the power may then be transmitted or received between the communication module 1090 and an external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1001 and the external electronic device 1004 via the server 1008 coupled with the second network 1099. Each of the electronic devices 1002 and 1004 may be a device of a same type as, or a different type from, the electronic device 1001. According to an embodiment, all or some of operations to be executed at the electronic device 1001 may be executed at one or more of the external electronic devices 1002, 1004, and/or 1008. For example, if the electronic device 1001 should perform a function or a service automatically, or in response to a request from a user or another device, the electronic device 1001, instead of or in addition to executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, or client-server computing technology may be used, for example.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1040) including one or more instructions that are stored in a storage medium (e.g., the internal memory 1036 or external memory 1038) that is readable by a machine (e.g., the electronic device 1001). For example, a processor (e.g., the processor 1020) of the machine (e.g., the electronic device 1001) may invoke at least one of the one or more instructions stored in the storage medium, and execute it with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply means that the storage medium is a tangible device, and does not solely include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc-read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 11:
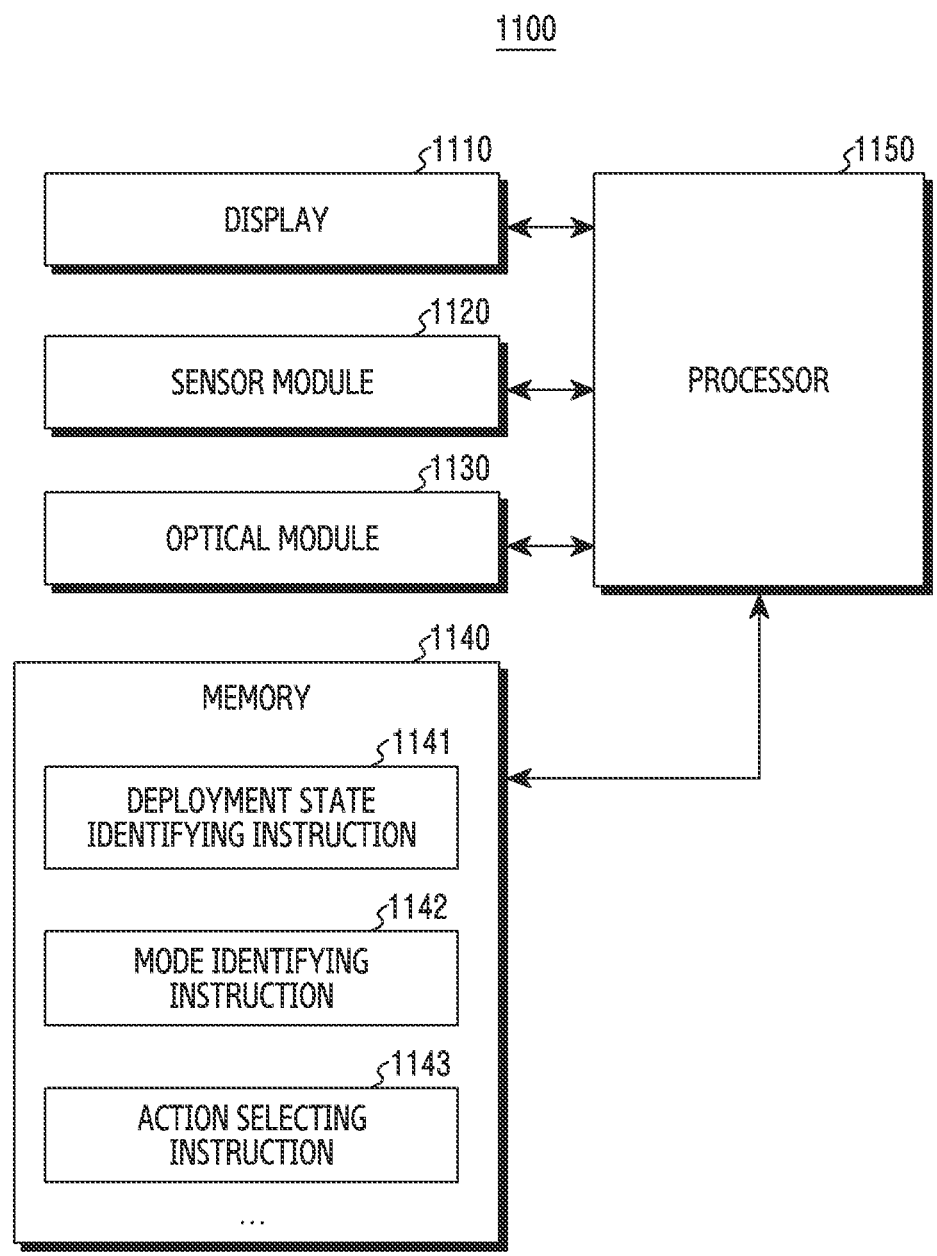
FIG. 11 is a block diagram of an electronic device according to an embodiment of the disclosure.

FIG. 11 is a block diagram of an electronic device according to an embodiment of the disclosure.

Referring to FIG. 11, an electronic device 1100 may include a display 1110, a sensor module 1120, an optical module 1130, a memory 1140, and a processor 1150. At least one of the components of the electronic device 1100 may be identical or similar to components of the electronic device 100 of FIG. 1A or 1B, the electronic device 300 of FIG. 4A or 4B, the electronic device 800 of FIG. 8A or 8B, or the electronic device 900 of FIG. 9A or 9B, and thus redundant descriptions will be omitted.

The display 1110 (e.g., the display device 1060 of FIG. 10) may include a flexible display (e.g., 120 of FIG. 1A or 1B, 320 of FIG. 4A or 4B, 820 of FIG. 8A or 8B, or 920 of FIG. 9A or 9B) which is slidably placed so that a screen of the electronic device 1100 can be reduced or extended. According to an embodiment, one side region (e.g., 121 of FIG. 1B or 321 of FIG. 4B) of the flexible display may be led into or led out from a housing through an access opening (e.g., 110E of FIG. 1A or 1B) constructed in the housing constructing an exterior of the electronic device 1100. The display 1110 may be in a first deployment state in which one side region of bendable portion 121 or bendable portion 321 of the flexible display is led out from the housing and a second deployment state in which one side region of the flexible display is led into the housing. When switched from the second deployment state to the first deployment state, since one side region of bendable portion 121 or bendable portion 321 of the flexible display is led out from the housing, the screen can be extended. When switched from the first deployment state to the second deployment state, since one side region of bendable portion 121 or bendable portion 321 of the flexible display is led into the housing, the screen can be reduced.

According to various embodiments, the display 1110 may indicate the flexible display 320 of FIG. 4A and a device including the second plate 330 and flexible plate 370 coupled thereto. According to some embodiments, the display 1110 may indicate the flexible display 820 of FIG. 8A and a device including the second plate 830, first flexible plate 871, and second flexible plate 872 coupled thereto. According to some embodiments, the display 1110 may indicate the flexible display 920 of FIG. 9A and a device including the second plate 930, first flexible plate 971, and second flexible plate 972 coupled thereto.

The sensor module 1120 may acquire data regarding the first deployment state or second deployment state of the display 1110. According to an embodiment, the sensor module 1120 may acquire data regarding a sliding direction or sliding distance of the display 1110. According to various embodiments, the sensor module 1120 may include at least part of the sensor 345 of FIG. 4A, sensor 845 of FIG. 8A, or sensor module 1076 of FIG. 10. For example, a hall integrated circuit (IC), a capacitance sensor, a pressure sensor, or the like may be responsive to movement of the display 1110.

The optical module 1130 may be covered by some regions of the display 1110 in the first deployment state, and may be exposed in the second deployment state. According to an embodiment, the optical module 1130 may indicate the component interface portion of FIG. 1B (an exposed region of the third face 110D in the open state 100b of FIG. 1B), and the components 104, 105, 106, and 114 disposed thereto. According to an embodiment, the optical module 1130 may indicate the component interface portion 3111a of FIG. 4B and a device including the camera module 410 aligned thereto. According to some embodiments, the optical module 1130 may include the optical module 890 of FIG. 8B or the optical module 990 of FIG. 9B.

The memory 1140 (e.g., the memory 1030 of FIG. 10) may store data, application programs, algorithms, or the like corresponding to various user functions and various basic operating systems required to operate the electronic device 1100. The processor 1150 (e.g., 1120 of FIG. 10) may perform various operations according to instructions included in the memory 1140. According to an embodiment, the memory 1140 may store a deployment state identifying instruction 1141, a mode identifying instruction 1142, and an action selecting instruction 1143. The deployment identifying instruction 1141 may include a routine which allows the processor 1150 to determine whether the display 1110 is in the first deployment state or the second deployment state on the basis of data acquired from the sensor module 1120. The mode identifying instruction 1142 may include a routine which allows the processor 1150 to identify a pending mode in which the electronic device 1100 currently operates. The mode of the electronic device 1100 may include a standby mode, a sleep mode (or a low power mode), a lock mode, a program execution state (e.g., an application execution mode) executed based on a user input or an event, or the like. According to various embodiments, the mode identifying instruction 1142 may include a routine which allows the processor 1150 to identify a screen currently being executed (e.g., a screen displayed through the display 1110 on the basis of an executed application (or program)). The action selecting instruction 1143 may include a routine which allows the processor 1150 to select and perform an action corresponding to the first deployment state or the second deployment state on the basis of the current mode of the electronic device 1100. According to various embodiments, the action selecting instructions 1143 may include a routine which allows the processor 1150 to select and perform a function corresponding to the first deployment state or the second deployment state on the basis of a screen currently being executed.

According to an embodiment, the processor 1150 may selectively activate at least part of the display 1110 in accordance with the action selecting instruction 1143. According to various embodiments, the processor 1150 may activate the optical module 1130 in the second disposition state in accordance with the action selecting instruction 1143.

According to some embodiments, the processor 1150 may identify regions for respectively performing the instructions 1141, 1142, and 1143 of the memory 1140.

The electronic device 1100 may be designed to further include the input device 1050, the audio output device 1055, the audio module 1070, the interface 1077, the haptic module 1079, the camera module 1080, the power management module 1088, the communication module 1090, the SIM 1096, the antenna module 1097, or the like. The memory 1120 may include instructions related to various operations regarding these components.

Figure 12:
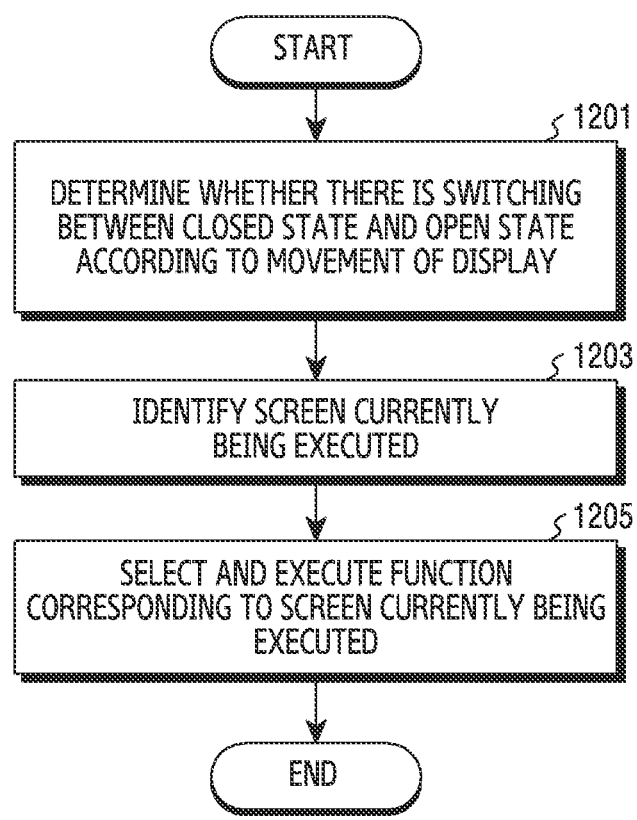
FIG. 12 illustrates an operational flow of an electronic device including a movable flexible display according to an embodiment of the disclosure.

FIG. 12 illustrates an operational flow of an electronic device including a movable flexible display according to an embodiment of the disclosure. FIGS. 13A, 13B, 14A, 14B, 15A, and 15B are drawings for explaining the operational flow of FIG. 12 according to various embodiments of the disclosure.

Figure 13A:
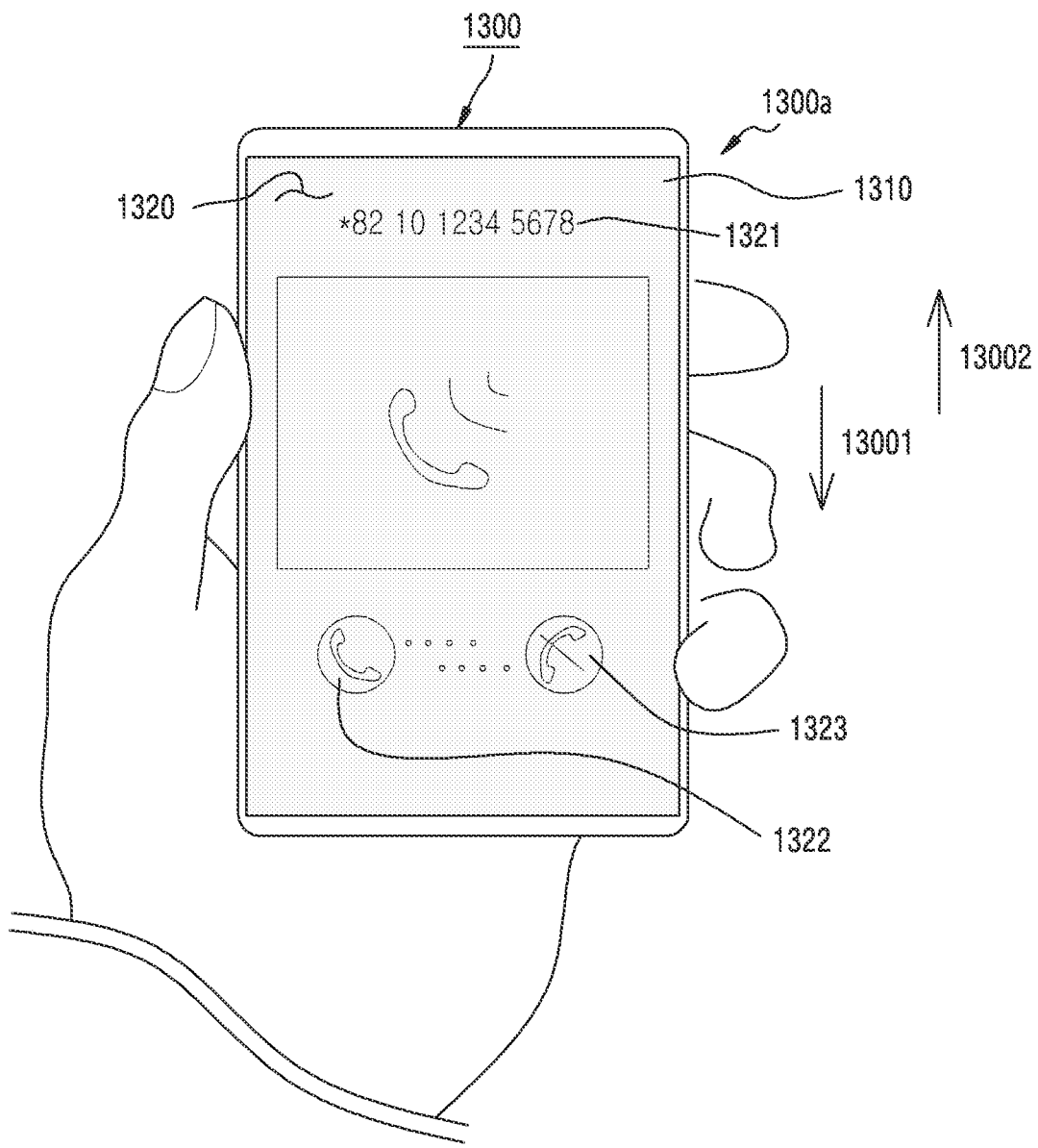
FIG. 13A is a drawing for explaining the operational flow of FIG. 12 according to various embodiments of the disclosure.
Figure 13B:
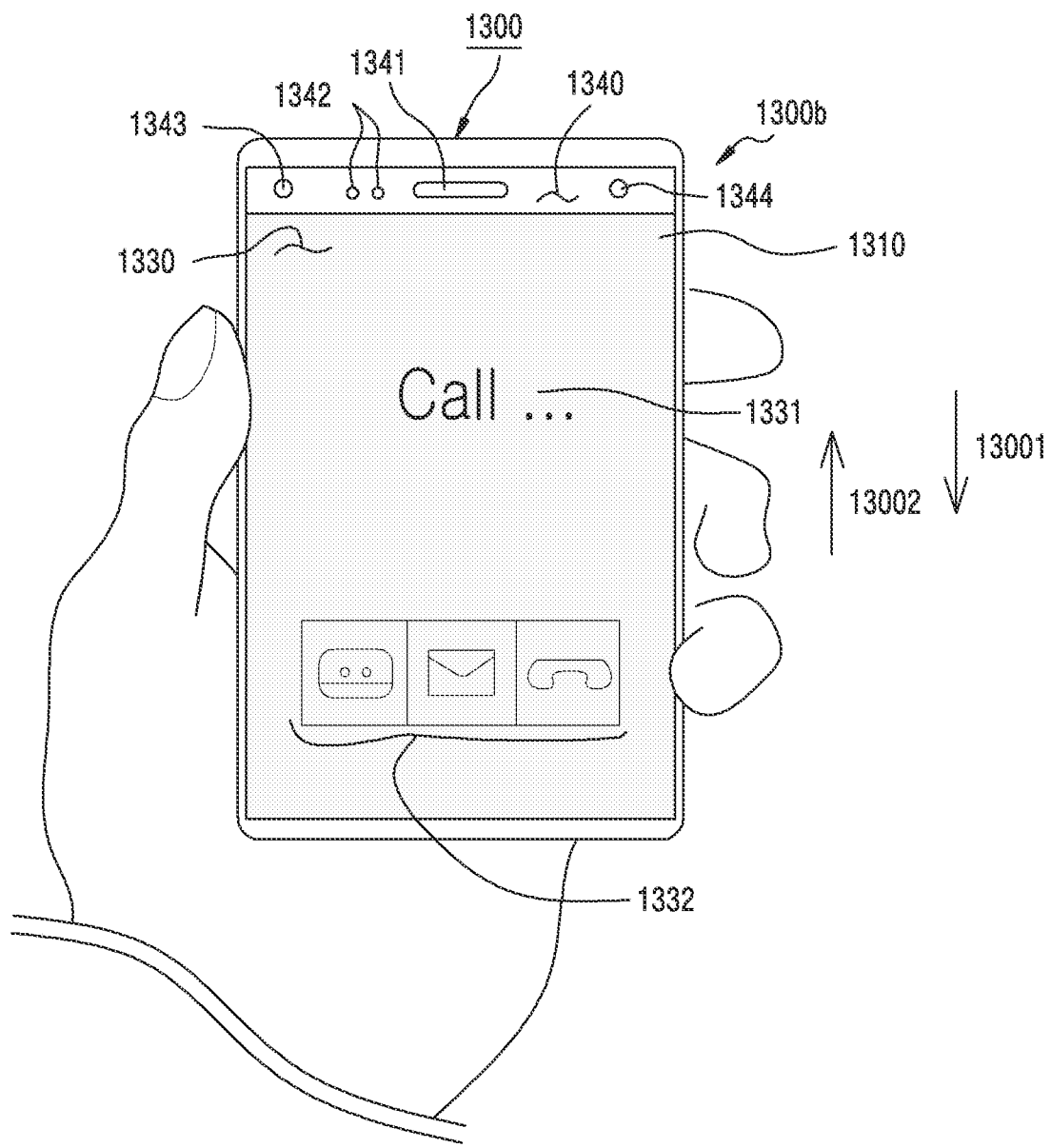
FIG. 13B is a drawing for explaining the operational flow of FIG. 12 according to various embodiments of the disclosure.

Referring to FIG. 12, in operation 1201, the processor 1150 may determine whether there is switching between a closed state and an open state according to movement of the display 1110. FIG. 13A illustrates a closed state 1300a of an electronic device 1300 in which a display 1310 is slid in a second direction 13002, and FIG. 13B illustrates an open state 1300b in which the display 1310 is slide in a first direction 13001. According to an embodiment, upon detecting that the display 1310 in the closed state 1300a is slid by more than a threshold distance in the first direction 13001, the processor 1150 may determine that the display 1310 is switched from the closed state 1300a to the open state 1300b. According to an embodiment, upon detecting that the display 1310 in the open state 1300b is slid by more than the threshold distance in the second direction 13002, the processor 1150 may determine that the display 1310 is switched from the open state 1300b to the closed state 1300a.

In operation 1203, the processor 1150 may identify a screen currently being executed (hereinafter, an execution screen). The execution screen may be defined as a screen displayed via the display 1310 on the basis of an executed application (or program). According to some embodiments, the processor 1150 may identify a pending mode in which the electronic device 1300 currently operates. A mode of the electronic device 1300 may include a standby mode, an execution state of a program executed based on a user input or an event, or the like.

In operation 1205, the processor 1150 may select and execute a function corresponding to the switching between the closed state and the open state, on the basis of the screen currently being executed. Referring to FIG. 13A, the electronic device 1300 may receive a call in the closed state 1300a, and may execute a call application related to the call reception. The call application may execute (or display) the screen 1320 related to the call reception via the display 1310. For example, the screen 1320 related to the call reception may include information 1321 regarding a phone number or the like for the received call, a first control element 1322 used when it is intended to establish a call, or a second control element 1323 used when it is intended not to establish the call. For example, the electronic device 1300 may establish the received call when there is a touch input for the first control element 1322, and may not establish the received call when there is a touch input for the second control element 1323. Referring to FIG. 13B, when switched from the closed state 1300a to the open state 1300b while receiving the call, the electronic device 1300 may establish the call by using a function corresponding to the screen 1320 related to the call reception. The call application may execute a screen 1330 related to the established call via the display 1310. For example, the screen 1330 related to the established call may include an element 1331 indicating that the call is established or a control element 1332 used for various functions related to the established call. According to an embodiment, in the open state 1300b, a receiver hole of module 1341 (e.g., 114 of FIG. 1B), proximity sensor 1342 (e.g., 104 of FIG. 1B), indicator 1343 (e.g., 106 of FIG. 1B), or camera module 1344 (e.g., 105 of FIG. 1B) which utilize a component interface portion 1340 may be exposed to the outside. Voice which is output during the call may be output to the outside via the receiver hole of module 1341 aligned to the receiver. According to an embodiment, the electronic device 1300 may activate the proximity sensor 1342 during the call in the open state 1300b. If the electronic device 1300 is close in distance to a user's head in order to align the receiver hole of module 1341 to a user's ear during the call, the electronic device 1300 may determine that an object such as the user's head is within a proximity recognition distance on the basis of a value detected from the proximity sensor 1342 and thus, may deactivate the display 1310. If the electronic device 1300 is far in distance from the user's head during the call, the electronic device 1300 may determine that the object such as the user's head is beyond the proximity recognition distance on the basis of the value detected from the proximity sensor 1342, and thus may activate the display 1310. According to various embodiments, when switched from the open state 1300b to the closed state 1300a during the call, the electronic device 1300 may end the call. In addition, when switched from the open state 1300b to the closed state 1300a, the electronic device 1300 may switch the proximity sensor 1342 covered by the display 1310 and the receiver aligned to the receiver hole of module 1341 to a disabled or inactive state.

Figure 14A:
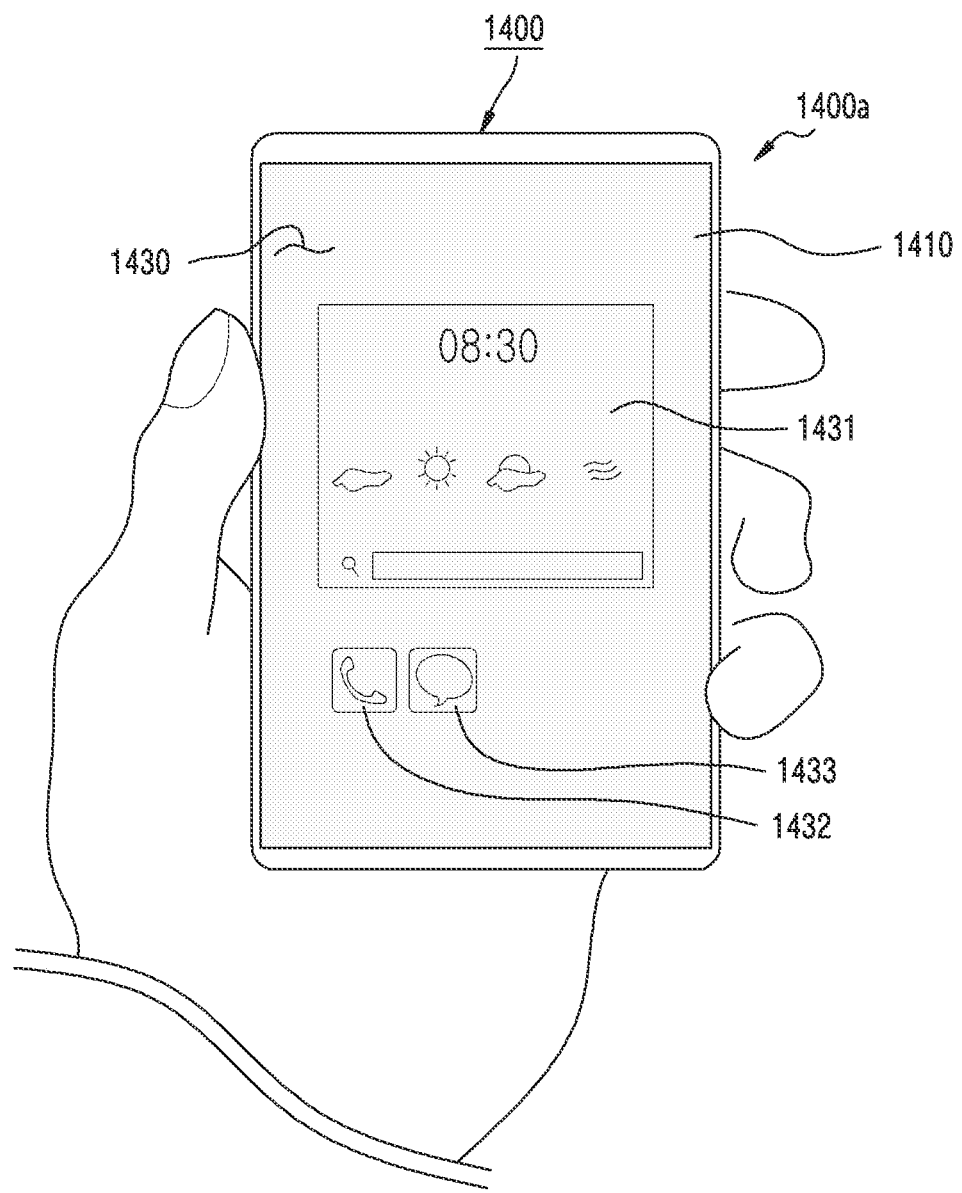
FIG. 14A is a drawing for explaining the operational flow of FIG. 12 according to various embodiments of the disclosure.

Referring to FIG. 14A according to another embodiment, a standby screen 1430 of an electronic device 1400 may be executed through a display 1410 in a closed state 1400a. For example, the screen 1430 may be executed when there is an input (e.g., an input using a key button) for switching the display 1410 from an off state to an on state. The standby screen 1430 may include a widget 1431, a call-related shortcut 1432, a message-related shortcut 1433, or the like according to a standby mode, and this may be based on an environmental configuration by a user. According to some embodiments, when the electronic device 1400 is set to a lock mode, if there is an input for switching the display 1410 from the off state to the on state, a lock screen (e.g., a password input screen, a touch pattern input screen, or the like) may be executed.

Figure 14B:
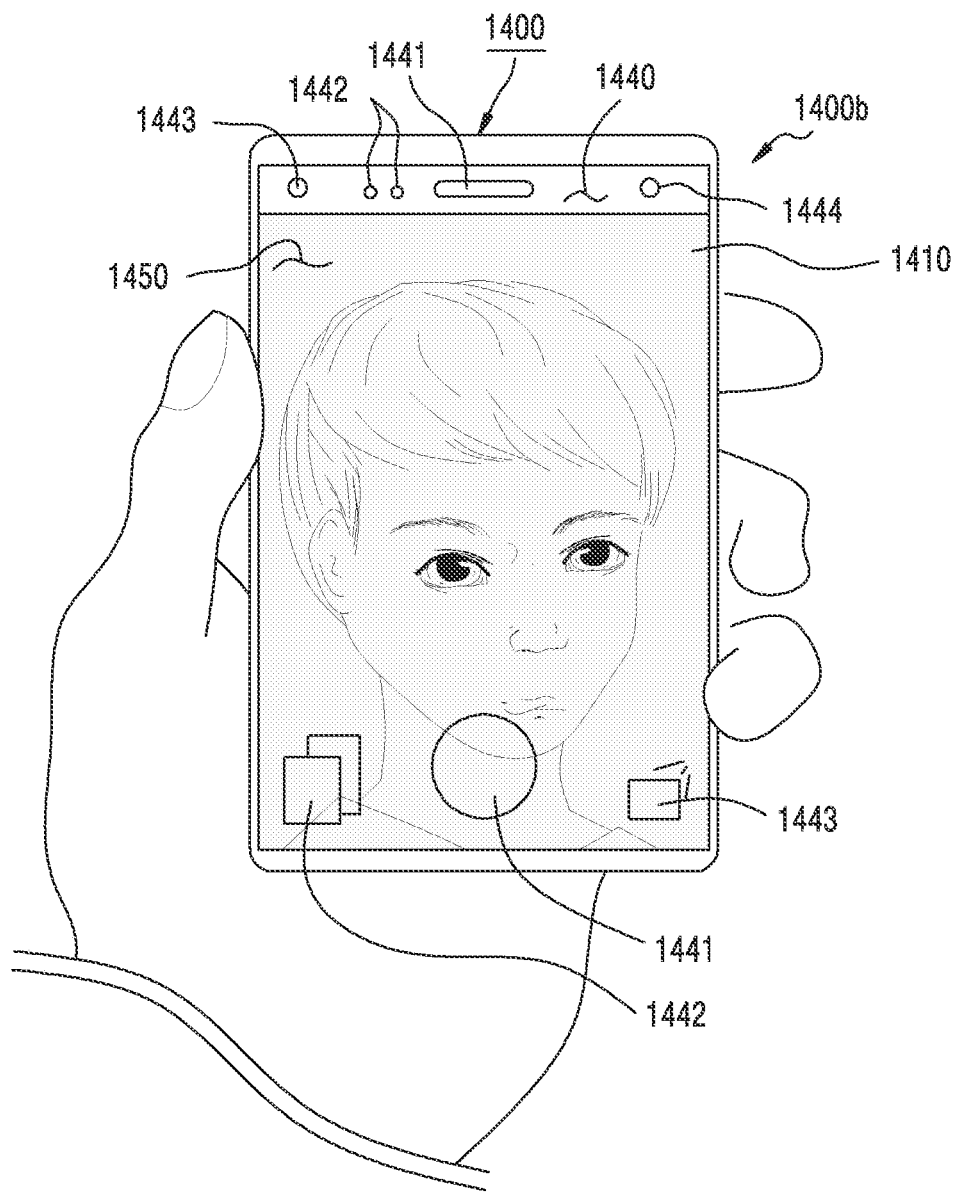
FIG. 14B is a drawing for explaining the operational flow of FIG. 12 according to various embodiments of the disclosure.

Referring to FIG. 14B, when switched from the closed state 1400a to an open state 1400b, a receiver hole of module 1441 (e.g., 114 of FIG. 1B), a proximity sensor 1442 (e.g., 104 of FIG. 1B), an indicator 1443 (e.g., 106 of FIG. 1B), or a camera module 1444 (e.g., 105 of FIG. 1B), which utilizes a component interface portion 1440, may be exposed to the outside. According to an embodiment, when switched from the closed state 1400a to the open state 1400b, the electronic device 1400 may execute a capturing application by using a function corresponding to the standby screen 1430 executed in the closed state 1400a. According to the executed capturing application, the electronic device 1400 may activate the camera module 1444 which utilizes the component interface 1440, and may execute a screen 1450 for displaying image data (e.g., preview image data), which is acquired through a camera module 1405, through the display 1410. According to an embodiment, the executed capturing application screen 1450 may include an element (e.g., a capturing button) 1441 for capturing, an element 1442 used to access a region in which images are stored, or an element 1443 used to configure various capturing effects, or the like. According to some embodiments, when switched from the closed state 1400a to the open state 1400b in the standby screen 1430 or the lock screen, the electronic device 1400 may activate a camera module (e.g., 112 or 113 of FIG. 2) disposed on a rear face of the electronic device 1400 and may execute the capturing application. According to various embodiments, upon sensing the switching from the second state 1400b to the first state 1400a while the capturing application is executed, the electronic device 1400 may end the capturing application and deactivate the camera module. According to various embodiments, upon sensing the switching from the second state 1400b to the first state 1400a while the capturing application is executed, the electronic device 1400 may automatically store a still image or moving image acquired through the camera module without an additional storing command.

Figure 15A:
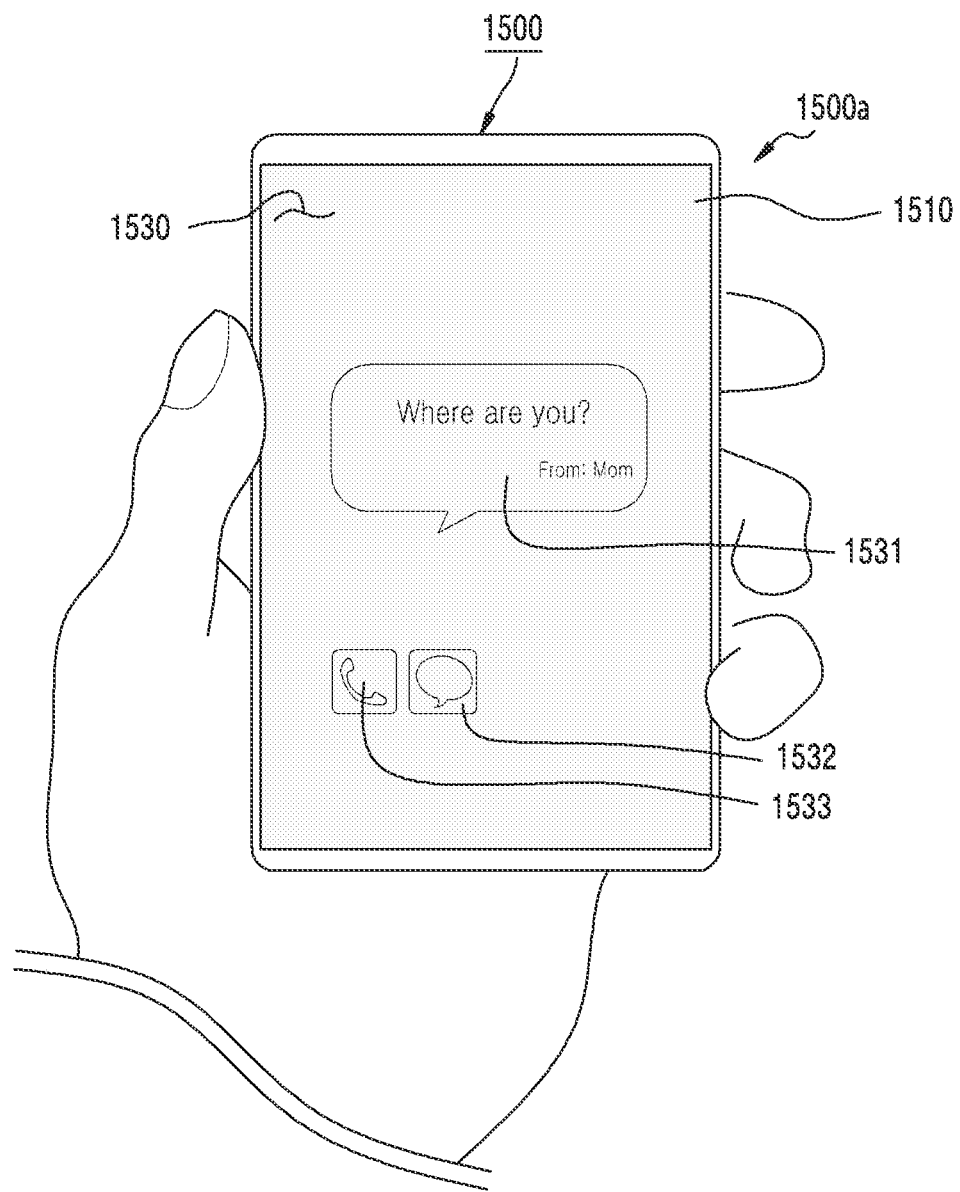
FIG. 15A is a drawing for explaining the operational flow of FIG. 12 according to various embodiments of the disclosure.

Referring to FIG. 15A according to another embodiment, upon receiving a short message service (SMS) message, multimedia message service (MMS) message, social network service (SNS) message, or the like from an external electronic device (e.g., 1002, 1004, or 1008 of FIG. 10) in a closed state 1500a, an electronic device 1500 may execute a message receiving application. The message receiving application may execute a screen 1530 through a display 1510 including an element 1531 including a received message and a destination, a shortcut 1532 used to execute an application for writing and transmitting a message to the destination, or a shortcut 1533 used to execute an application for a call to the destination.

Figure 15B:
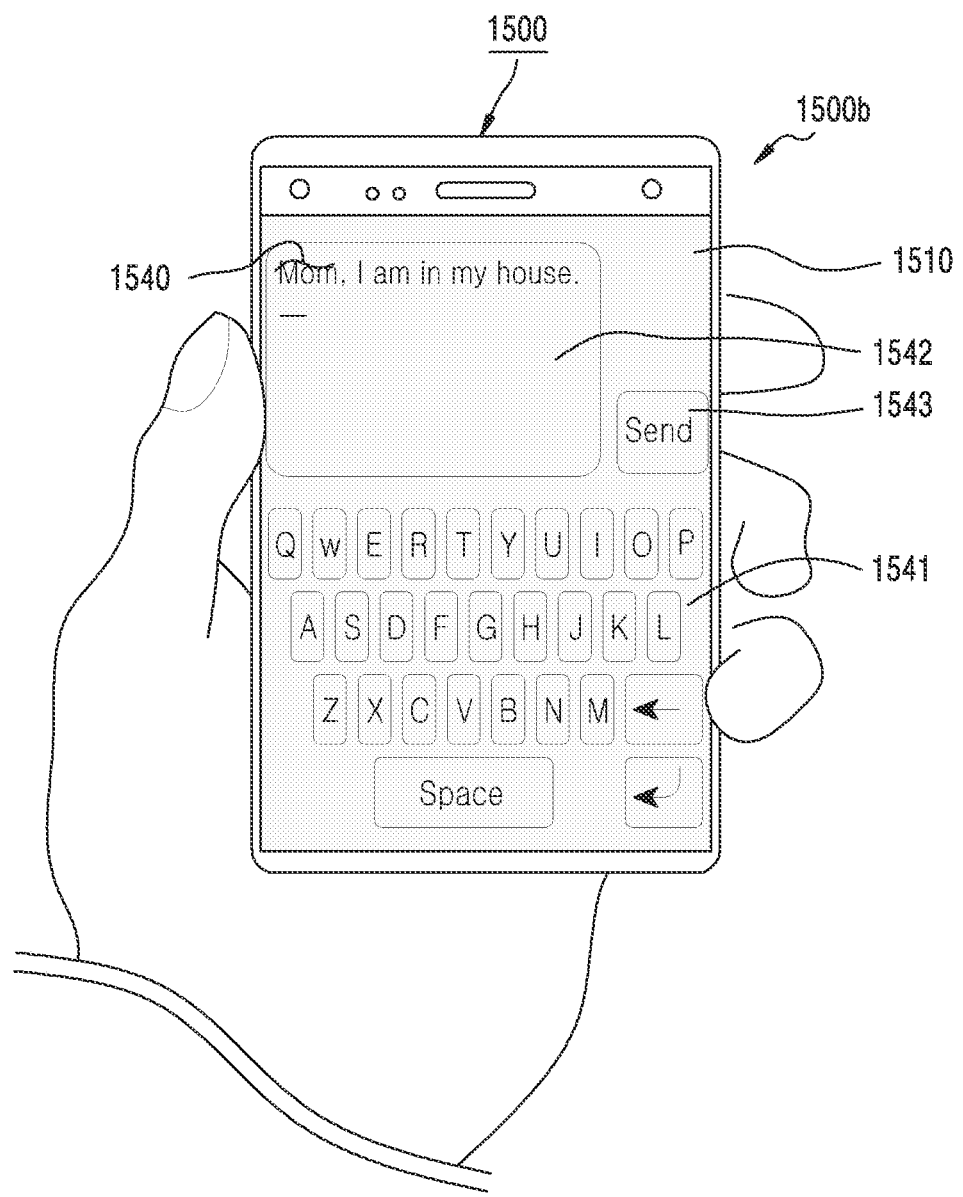
FIG. 15B is a drawing for explaining the operational flow of FIG. 12 according to various embodiments of the disclosure.

Referring to FIG. 15B, when switched from the closed state 1500a to an open state 1500b, the electronic device 1500 may execute a message transmitting application corresponding to the screen 1530 related to the received message. The message transmitting application may execute a screen 1540 through the display 1510. Herein, the screen 1540 includes a keyboard 1541, a region 1542 in which a character input is displayed through the keyboard 1541, and/or an element 1543 for transmission. According to various embodiments, when switched from the open state 1500*b* to the closed state 1500*a* while the message transmitting application is executed, the electronic device 1500 may end the message transmitting application. According to various embodiments, if there is text being written through the keyboard when the message transmitting application ends, the electronic device 1500 may temporarily store this text.

The electronic device may select and perform various actions corresponding to the switching between the closed state and the open state on the basis of other various modes.

Referring again to FIGS. 3, 4A and 4B, according to an embodiment of the disclosure, the electronic device 300 may include the housing including the first plate 390 having the first face 3901 and the second face 3902 facing away from the first face 3901, the first sidewall 3101 perpendicular to the first plate 390, the second sidewall 3102 perpendicular to the first sidewall 3101 and the first plate 390, the third sidewall 3103 perpendicular to the first sidewall 3101 and the first plate 390 and parallel to the second sidewall 3102, and the fourth sidewall 3104 perpendicular to the first plate 390 and parallel to the first sidewall 3101, and including the recess 3105 consisting of the first face 3901 of the first plate 390, the first sidewall 3101, the second sidewall 3102, the third sidewall 3103, and the fourth sidewall 3104. The electronic device 300 may include the inner structure 311 extended from the first sidewall 3101, the second sidewall 3102, and the third sidewall 3103, and disposed to be spaced apart from the second face 3902.

The electronic device 300 may include a flexible touchscreen layer (e.g., the flexible display 320) movable between the open state 300*b* and the closed state 300*a* with respect to the first sidewall 3101 in a first direction parallel to the first plate 390 and the second sidewall 3102. The flexible touchscreen layer 320 may have the periphery 324 extended along the first sidewall. The periphery 324 may be located at a first distance from the first sidewall 3101 in the closed state 300*a*, and may be located at a second distance d2 longer than the first distance from the first sidewall 3101 in the open state 300*b*. The flexible touchscreen layer 320 may include the planar portion 322 extended to cover at least part of the recess 3105, and the bendable portions 321 and 323 located in the vicinity of the fourth sidewall 3104 and extended to the recess 3105 from the planar portion 322. When the flexible touchscreen layer 320 may be moved from the open state 300*b* to the closed state 300*a*, at least one bendable portion 321 of the bendable portions 321 and 323 may be led out from the recess 3105 to construct substantially a plane between the planar portion 322 and the fourth sidewall 3104.

According to an embodiment of the disclosure, the inner structure 311 may include the third face 3111 facing away from the first face 3901, and at least the portion 3111*a* of the third face 3111 may be exposed to the outside in the open state 300*b*.

According to an embodiment of the disclosure, the electronic device 300 may further include at least one electronic component exposed to the outside through the opening 3111*d* constructed by penetrating the inner structure in the open state 300*b*, and covered by the flexible touchscreen layer 320 in the closed state 300*a*.

According to an embodiment of the disclosure, the at least one electronic component may include at least one of a sensor, a speaker, a camera (e.g., the camera module 410), and an image sensor.

According to an embodiment of the disclosure, the bendable portions 321 and 323 may be moved along the inner curved face 310*bc* constructed on the fourth sidewall 3104 when switched between the open state 300*b* and the closed state 300*a*.

According to an embodiment of the disclosure, the electronic device 300 may further include the support structure 360 coupled to the inner structure 311 and having the curved face 3621 corresponding to the inner curved face 310*bc* of the fourth sidewall 3104. The curved space 300E in which the bendable portions 321 and 323 are disposed may be constructed by the inner curved face 310*bc* of the fourth sidewall 3104 and the curved face 3621 of the support structure 360.

According to an embodiment of the disclosure, the electronic device 300 may further include a rigid plate (e.g., the second plate 330) coupled to the planar portion 322 of the flexible touchscreen layer 320.

According to an embodiment of the disclosure, referring again to FIG. 7A, the second plate 330 may include the sidewall portion 712 disposed to cover the side faces 320*aa*, 320*bb*, and 320*cc* of the periphery 324 of the flexible touchscreen layer 320.

According to an embodiment of the disclosure, the flexible touchscreen layer 320 may include the light-transmitting plate 320*a* which constitutes an outer face of the electronic device 300. The light-transmitting plate 320*a* may be extended to cover part of a rear face of the second plate 330.

According to an embodiment of the disclosure, referring again to FIGS. 7B and 7C, the electronic device 300 may further include the organic adhesive layers 750 and 780 disposed between the light-transmitting plate 320*a* and the second plate 330.

According to an embodiment of the disclosure, referring again to FIG. 7C, the groove 76021 in which the light-transmitting plate 320*a* is disposed may be constructed in the rear face of the second plate 330. The light-transmitting plate 320*a* may not protrude with respect to the rear face of the second plate 330.

According to an embodiment of the disclosure, the electronic device 300 may further include the flexible plate 370 coupled to the bendable portions 321 and 323 of the flexible touchscreen layer 320.

According to an embodiment of the disclosure, the flexible plate 370 may include a structure in which concavity and convexity are arranged along a length extended from one end 371 to the other end 372.

According to an embodiment of the disclosure, the electronic device 300 may further include at least one sensor 345 for sensing switching between the closed state 300*a* and the open state 300*b*.

According to an embodiment of the disclosure, the electronic device 300 may further include the processor 1020 or 1150. The processor 1020 or 1150 may be configured to select and execute a function corresponding to an executed screen when switching between the closed state 300*a* and the open state 300*b* is identified.

According to an embodiment of the disclosure, the electronic device 100 may include the housing 110 and the flexible display 120 slidably coupled to the housing 110 so that the first region of bendable portion 121 of the first region of bendable portion 121 and the second region of planar portion 122, which constitute the screen 1201, can be led into the housing 110. The electronic device 100 may include a portion (e.g., an exposed region of the third face 110D in the open state 100*b* of FIG. 1B) which is exposed when the first region of bendable portion 121 is led into the housing 110 and which is covered by the second region of planar portion 122 when the first region of bendable portion 121 is led out from the housing 110, and at least one or more electronic components 104, 106, 105, and 114 which utilize the portion.

According to an embodiment of the disclosure, when the first region of bendable portion 121 is led into the housing 110, it may be moved by being guided to the curved space 300E constructed inside the housing 110.

According to an embodiment of the disclosure, the at least one electronic component may include at least one of a light emitting device, a light receiving device, and a sound output device.

According to an embodiment of the disclosure, there is provided a method of operating an electronic device including a flexible display slidably coupled to the housing so that a first region of the first region and second region, which constitute a screen, can be led into the housing. The method may include the operation of identifying a screen executed through the flexible display upon detecting switching between a first state in which the first region is led out from the housing and a second state in which the first region is led into the housing, and the operation of selecting and executing a function corresponding to the identified screen.

According to an embodiment of the disclosure, the electronic device may include a portion which is exposed when the first region is led into the housing and which is covered by the second region when the first region is led out from the housing, and a proximity sensor and a receiver which utilize the portion. In the operation of selecting and executing the function corresponding to the identified screen, a call may be established and the proximity sensor and the receiver may be activated upon detecting switching from the first state to the second state in a call reception mode.

While the disclosure has been shown and described with reference to various embodiments thereof, it will be understood by those skilled in the art that various changes in form and detail may be made therein without departing from the spirit and scope of the disclosure as defined by the appended claims and their equivalents.

What is claimed is:

1. An electronic device comprising:
  a housing comprising:
    a first plate,
    a first sidewall extending from one end of the first plate toward a front of the electronic device,
    a second sidewall extending from an opposite end of the first plate toward the front of the electronic device, and
    an inner structure coupled with the first sidewall or the second sidewall, and being spaced apart from the first plate;
  a flexible display movably assembled to the housing, and comprising a planar portion disposed on the inner structure and a bendable portion extending from the planar portion along a vicinity of the second sidewall;
  a flexible plate disposed along a rear face of the bendable portion; and
  at least one electronic component disposed between the first plate and the flexible plate,
  wherein, when the planar portion moves in a first direction, the electronic device is in a first state where an one portion of the bendable portion is led into the housing,
  wherein, when the planar portion moves in a second direction opposite to the first direction, the electronic device is in a second state where the one portion of the bendable portion is led out from the housing, and
  wherein at least part of the at least one electronic component is aligned with an opening formed in the flexible plate and a concave portion formed in the flexible display when the electronic device is in the second state such that the at least part of the at least one electronic component is viewable from an outside through the opening and the concave portion.

2. The electronic device of claim 1, wherein, when the electronic device is in the second state, the at least one electronic component receives light from the outside through the opening and the concave portion, and emits light to the outside through the opening and the concave portion.

3. The electronic device of claim 1,
  wherein the flexible display comprises:
    a light-transmitting plate,
    a panel disposed under the light-transmitting plate, and
    a substrate disposed under the panel, and
  wherein the concave portion comprises a shape in which part of the panel and part of the substrate are removed.

4. The electronic device of claim 1, further comprising:
  at least one processor,
  wherein the at least one processor is configured to inactivate a region of the flexible display corresponding to the opening, when the electronic device is in the second state.

5. The electronic device of claim 1, further comprising:
  at least one processor,
  wherein the at least one processor is configured to inactivate a region of the flexible display corresponding to the one portion of the bendable portion led into the housing, when the electronic device is in the first state.

6. The electronic device of claim 1, wherein the at least one electronic component comprises at least one of a sensor, a speaker, a camera, or an image sensor.

7. The electronic device of claim 1, wherein the bendable portion is configured to be moved along an inner curved face constructed on the second sidewall in response to a movement of the electronic device between the first state and the second state.

8. The electronic device of claim 1, further comprising:
  a rigid plate slidably disposed between the flexible display and the inner structure,
  wherein the planar portion of the flexible display is maintained flat by the rigid plate.

9. The electronic device of claim 1, further comprising at least one sensor configured to sense movement between the first state and the second state.

10. The electronic device of claim 9, wherein the at least one electronic component is configured to controlled in response to the at least one sensor sensing the movement.

11. The electronic device of claim 1, wherein the first sidewall or the second sidewall comprises a curved plate including an inner curved face.

12. The electronic device of claim 1, wherein the flexible plate comprises a structure in which concavity and convexity are arranged along a length extended from one end to the other end.

* * * * *